United States Patent
Ma et al.

(10) Patent No.: US 8,426,839 B1
(45) Date of Patent: Apr. 23, 2013

(54) CONDUCTING BRIDGE RANDOM ACCESS MEMORY (CBRAM) DEVICE STRUCTURES

(75) Inventors: Yi Ma, Santa Clara, CA (US); Chakravarthy Gopalan, Santa Clara, CA (US); Antonio R. Gallo, San Jose, CA (US); Janet Wang, Los Altos, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 137 days.

(21) Appl. No.: 12/767,552

(22) Filed: Apr. 26, 2010

Related U.S. Application Data

(60) Provisional application No. 61/172,667, filed on Apr. 24, 2009.

(51) Int. Cl.
  *H01L 45/00* (2006.01)
  *H01L 29/04* (2006.01)
  *H01L 29/12* (2006.01)
(52) U.S. Cl.
  USPC .................... 257/4; 257/3; 257/E45.002
(58) Field of Classification Search .............. 257/2, 3, 257/4, E45.001, E45.002, 5
  See application file for complete search history.

(56) References Cited

U.S. PATENT DOCUMENTS

| | | | |
|---|---|---|---|
| 5,761,115 | A | 6/1998 | Kozicki et al. |
| 6,418,049 | B1 | 7/2002 | Kozicki et al. |
| 6,487,106 | B1 | 11/2002 | Kozicki et al. |
| 6,635,914 | B2 | 10/2003 | Kozicki et al. |
| 6,927,411 | B2 | 8/2005 | Kozicki |
| 7,101,728 | B2 | 9/2006 | Kozicki et al. |
| 7,332,377 | B2 | 2/2008 | Happ et al. |
| 7,368,314 | B2 | 5/2008 | Ufert |
| 7,372,065 | B2 | 5/2008 | Kozicki et al. |
| 7,385,219 | B2 * | 6/2008 | Kozicki et al. ............. 257/4 |
| 7,423,281 | B2 | 9/2008 | Rohr |
| 7,700,398 | B2 | 4/2010 | Pinnow |
| 7,718,537 | B2 | 5/2010 | Ufert |
| 7,728,322 | B2 | 6/2010 | Kozicki |
| 7,829,134 | B2 | 11/2010 | Pinnow et al. |
| 2004/0124407 | A1 | 7/2004 | Kozicki et al. |
| 2008/0217670 | A1* | 9/2008 | Dahmani ................ 257/296 |
| 2009/0218567 | A1* | 9/2009 | Mathew et al. ............ 257/52 |
| 2009/0239378 | A1* | 9/2009 | Kashefizadeh et al. ...... 438/685 |
| 2011/0027597 | A1 | 2/2011 | Ohba et al. |
| 2011/0031466 | A1 | 2/2011 | Kagawa et al. |

* cited by examiner

*Primary Examiner* — Jerome Jackson, Jr.
*Assistant Examiner* — Paul Budd

(57) ABSTRACT

A conductive bridging memory cell may include an ion conductor layer formed over an active electrode that is a source of conductive ions for the ion conductor; a conductive layer; and a barrier layer formed below the active layer and in contact with the conductive, the barrier layer substantially preventing a movement of conductive ions therethrough.

11 Claims, 17 Drawing Sheets

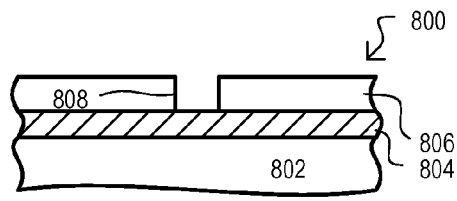
FIG. 8A
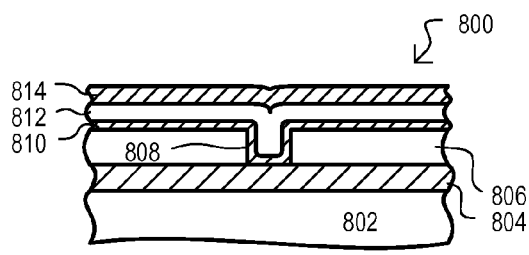
FIG. 8B
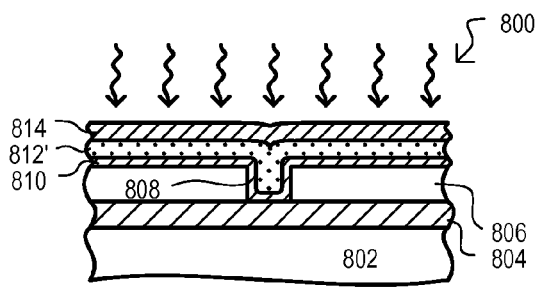
FIG. 8C
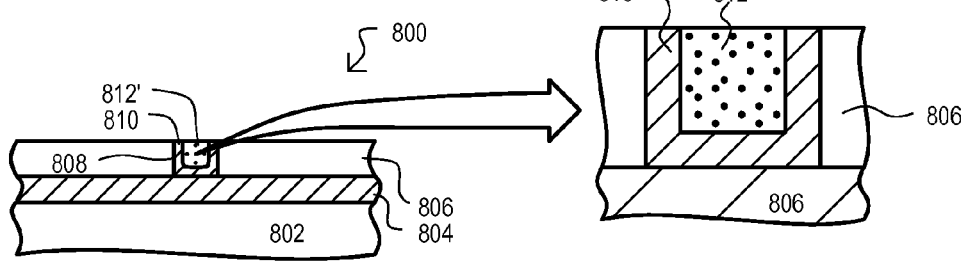
FIG. 8D
FIG. 8E

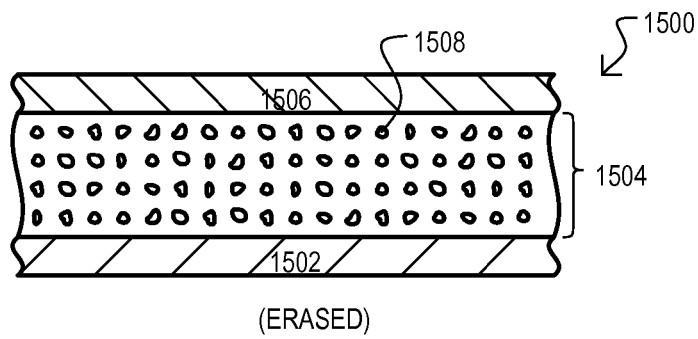
FIG. 15 (ERASED)
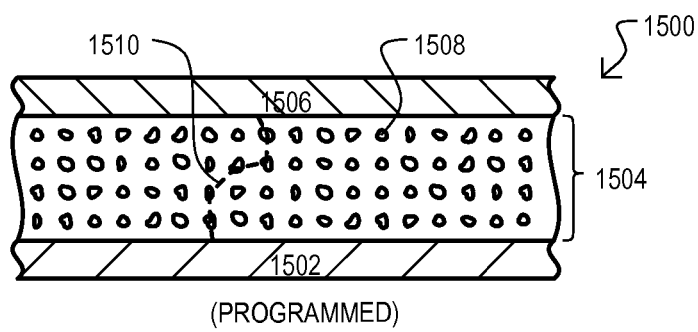
FIG. 16 (PROGRAMMED)
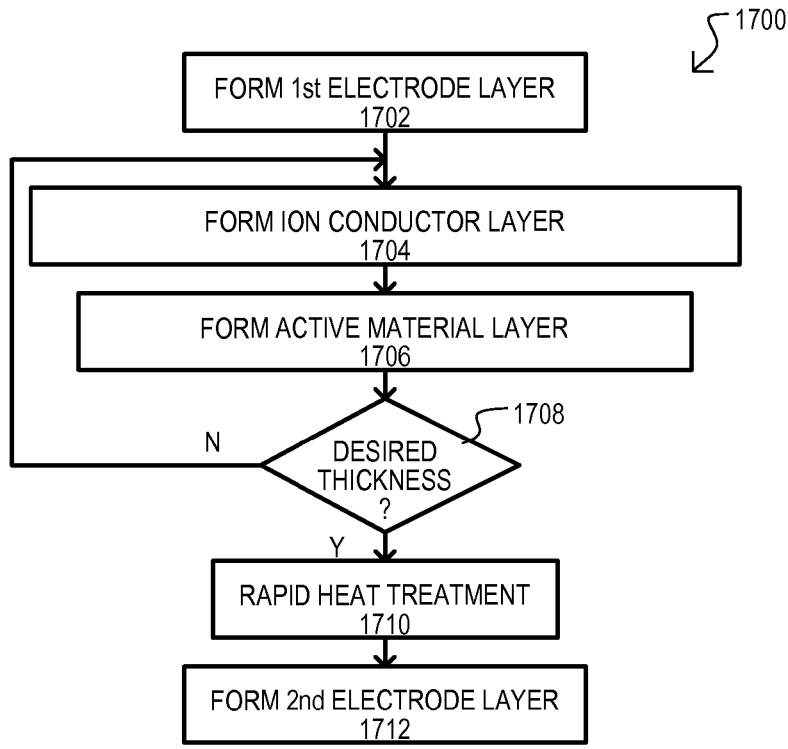
FIG. 17

CONDUCTING BRIDGE RANDOM ACCESS MEMORY (CBRAM) DEVICE STRUCTURES

This application claims the benefit of U.S. Provisional Patent Application Ser. No. 61/172,667, filed on Apr. 24, 2009, the contents of which are incorporated by reference herein.

TECHNICAL FIELD

The present invention relates generally to memory devices having variable impedance elements, and more particularly to conductive bridge random access memory (CBRAM) type devices.

BACKGROUND ART

Conductive bridge random access memory (CBRAM) cells (sometimes referred to programmable metallization cells (PMCs), may switch between impedance states in response to the application of a voltage or current. CBRAM cells may switch between states through mobile ions formed in an ion conductor layer. An ion conductor layer may be formed between an "active" electrode and an "indifferent" electrode. An active electrode may be a source of conductive ions. An indifferent electrode may not be a source of conductive ions.

FIGS. 24A to 24D show a conventional method of forming a CBRAM cell 2400.

FIG. 24A shows the formation of a bottom electrode 2402 on a surface 2404. A bottom electrode 2402 is an "indifferent" electrode. A surface 2404 is typically formed from an insulating material. A bottom electrode 2402 may be formed within an insulating layer 2406. An opening 2408 in the insulating layer 2406 exposes the bottom electrode 2402. Bottom electrode 2402 does not serve as a source for conductive ions for a subsequently formed ion conductor layer.

FIG. 24B shows the formation of an ion conductor layer 2410 over and in contact with bottom electrode 2402. A top electrode 2412 is formed on ion conductor layer 2410. A top electrode 2412 may be an active electrode, and thus may be a source of conductive ions for ion conductor layer 2410.

FIG. 24C shows an ion incorporation step. Light (e.g., UV light), may be applied and conductive ions from top electrode 2412 may be incorporated into ion conductor layer 2410.

FIG. 24D shows a cap layer 2414 formed on a surface of top electrode layer to keep the top electrode material from reacting with exposed ambient in subsequent device processing.

BRIEF DESCRIPTION OF THE DRAWINGS

FIGS. 8A to 8E are side cross sectional views showing a method of forming a conductive bridging memory cell with a sacrificial ion source layer according to an embodiment.

FIGS. 15 and 16 are representation of different states of a conductive bridging memory cell according to an embodiment.

FIG. 17 is a flow diagram of a method of forming a conductive bridging memory cell according to an embodiment.

DETAILED DESCRIPTION

Figure 24A:
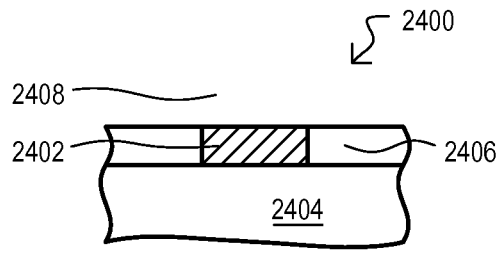
FIGS. 24A to 24D are side cross sectional views of a conventional method of forming a conductive bridging memory cell.
Figure 24B:
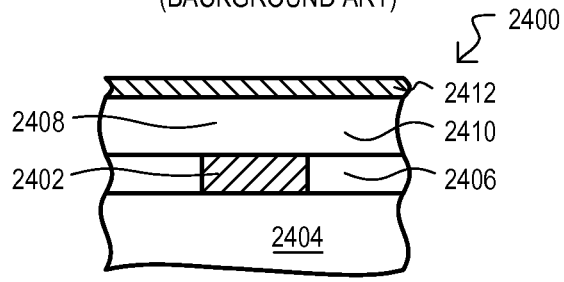
Figure 24C:
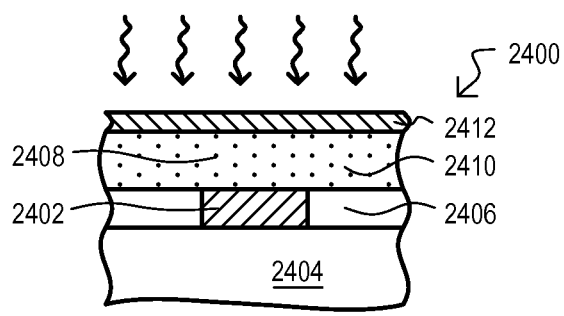
Figure 24D:
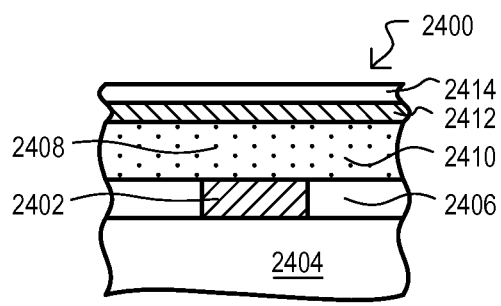

Various embodiments will now be described that shows conductive bridging random access memory (CBRAM) type memory cells, as well as methods for fabricating such cells. In particular embodiments, an ion conductor layer within a CBRAM structure can be altered to control an incorporation rate of conductive ions within such a layer. Such an ion incorporation controlling mechanism may enable greater flexibility and/or controllability in fabricating a CBRAM, as compared to conventional arrangements like that shown in FIGS. 24A to 24D. In such conventional approaches, an ion incorporation rate may be dictated by the ion conductor material, as well as the ion source layer (i.e., the top electrode 2412 in FIGS. 24B to 24D).

While memory cells are referred to as conductive bridging "random access memory" cells, such cells are not limited to a random access type of memory architecture.

Figure 1:
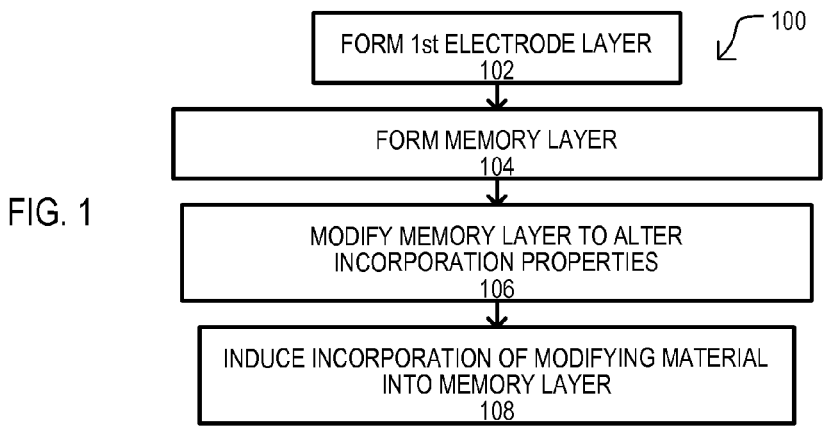
FIG. 1 is a flow diagram showing a method according to an embodiment.

Referring now to FIG. 1, a method according to a first embodiment is shown in a flow diagram and designated by the general reference character 100. A method 100 shows a manufacturing of a CBRAM cell.

A method 100 may include forming a first electrode layer (step 102). In one embodiment, such a first electrode layer may be an "indifferent" electrode that does not serve as a source for conductive ions in a subsequently formed ion conductor layer.

A method 100 may also include forming a memory layer (step 104). In particular embodiments, a memory layer may be programmed between two or more impedance states once a modifying material is incorporated into the memory layer. As but one example, a memory layer may be an ion conductor layer that may serve as a programmable impedance element when conductive ions are incorporated therein. More particularly, a memory layer may have a resistance that may be decreased when a voltage/current applied across the layer exceeds a threshold. Such a resistance may be returned to a higher level by application of a reverse polarity voltage/current. In very particular embodiments, a memory layer may be a combination of germanium and sulfur ($GeS_2$) doped with an active metal, such as silver (Ag), as but one example.

A memory layer may then be modified to alter the incorporation properties of the memory layer (step 106). Such a step may include altering a rate at which a modifying material may move into a memory layer. In one embodiment, such a modification may alter a current conducting filament mechanism that may create low resistance paths through a memory layer. Accordingly, in a method 100, an incorporation rate may be changed, and not dictated by a starting composition of a resistive memory layer, as may be the case in a conventional approach, like that shown in FIGS. 24A to 24D. Modification of a memory layer may include, but is not limited to: introducing an incorporation rate altering film separate from the memory layer; or treating a surface of a memory layer; or densifying or reducing the density of a memory layer, or forming a concentrated layer of the modifying material (e.g., conductive ions) within a memory layer.

A method 100 may further include inducing incorporation of a modifying material into the memory layer (step 108). Such a step may include subjecting a memory structure to conditions that enable a modifying material to be formed within a memory layer, to thereby form a programmable memory element, such as a CBRAM cell. In certain embodiments, such incorporation may be through a surface of a memory layer, or may be a material formed within a memory layer as the memory layer is being deposited (i.e., in situ formation).

In one particular embodiment, a resistive memory layer may be an ion conductor and a modifying material may include conductive ions. Application of light and/or heat may induce incorporation of such conductive ions into the ion conductor layer.

In this way, a memory layer of a CBRAM type cell may be modified to alter an incorporation rate of a modifying material into such a layer.

Referring now to FIGS. 2A to 2D, methods for forming a CBRAM stack structure according to various embodiments are shown in a series of side cross sectional views.

Figure 2A:
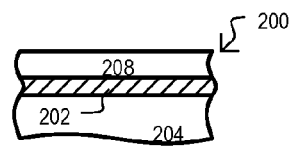
FIGS. 2A to 2D are a series of side cross sectional views showing methods of modifying an ion conductor layer according to various embodiments.

FIG. 2A shows a CBRAM structure 200 having a first electrode 202 formed on an underlying layer 204. An ion conductor layer 208 may be formed over and in contact with a first electrode 202.

In one very particular embodiment, a first electrode 202 may be an indifferent electrode formed from a conductive material that is not a substantial source of conductive ion for ion conductor layer 208. In very particular embodiments, a first electrode 202 may include any of: aluminum, tantalum, or tantalum nitride, as but a few examples.

An underlying layer 204 may be made from an insulating material, including any of: silicon dioxide (undoped or doped), silicon nitride, silicon oxynitride, a "low-k" dielectric, and/or combinations thereof, as but a few examples. An ion conductor layer 208 may be a material that enables conductive ions, through electrodeposit and electrodissolution, to decrease or increase a resistance of the ion conductor layer 208. In very particular embodiments, an ion conductor layer can be a germanium sulfur compound, more particularly $GeS_2$.

Figures 0, 1, 2, 2B, 3:
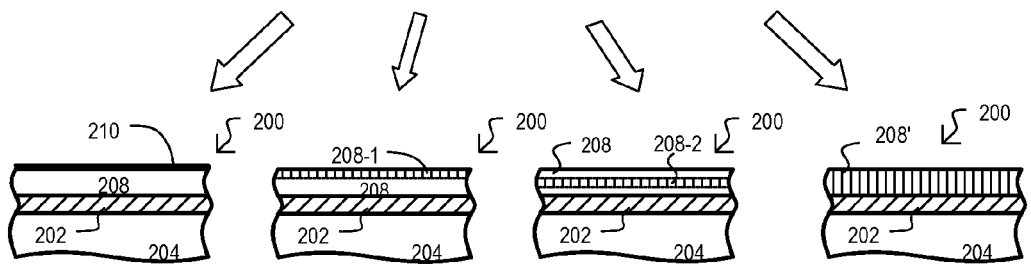

FIG. 2B-0 shows a modification of an ion conductor to alter an ion incorporation rate according to one particular embodiment. A limiting layer 210 may be formed on a surface (in this particular example, a top surface) of ion conductor layer 208. Such a layer may be contiguous, or not contiguous, and may serve to alter a rate at which conductive ions may be incorporated into ion conductor layer 208 through the top surface.

FIG. 2B-1 shows a modification of an ion conductor to alter an ion incorporation rate according to another particular embodiment. A surface portion of ion conductor layer 208, shown as 208-1, may be modified to provide different properties that affect an ion incorporation rate, as compared to a remainder (i.e., unmodified portion) of the ion conductor layer.

FIG. 2B-2 shows a modification of an ion conductor to alter an ion incorporation rate according to yet a further particular embodiment. An intermediate portion of ion conductor layer 208, shown as 208-2, may be modified to provide different incorporation properties than a remainder of the ion conductor layer.

FIG. 2B-3 shows a modification of an ion conductor to alter an ion incorporation rate according to yet another particular embodiment. Substantially all of an ion conductor layer 208' may be modified to provide different incorporation properties.

It is noted that any or all of the modification methods shown in the embodiments of FIGS. 2B-0 to 2B-3 may be combined in the fabrication of a CBRAM cell structure.

Figure 2C:
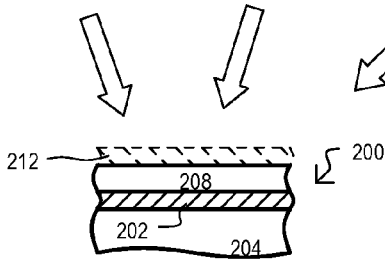

Referring now to FIG. 2C, a conductive ion source layer 212 may be formed. A conductive ion source layer may be formed on a surface opposite to that of a first electrode 202. That is, an ion conductor layer 208 may be formed between a first electrode 202 and a conductive ion source layer 212. An ion source layer 212 may be a source for ions that are incorporated into an ion conductor layer 208. In very particular embodiments, an ion source layer 212 may be retained as all or a portion of an "active" (or oxidizable) electrode 212. In very particular embodiments, an ion conductor layer 208 may include $GeS_2$, and an ion source layer may include silver or copper.

Figure 2D:
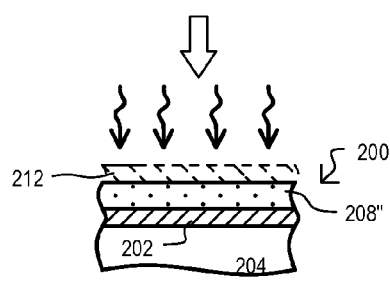

FIG. 2D shows an incorporation step that may result in an ion conductor layer being modified by an incorporation of ions, to create a modified ion conductor layer 208". The various modification approaches shown in FIGS. 2B-0 to 2B-3 may allow an incorporation rate to slowed or increased as compared to arrangements that place an active electrode on an unmodified ion conductor layer.

In this way, layers of a CBRAM type cell may be modified to alter an incorporation rate of ions into an ion conductor layer.

Referring now to FIGS. 3A to 3D, a method for forming a CBRAM stack structure according to an embodiment is shown in a series of side cross sectional views. The embodiment of FIGS. 3A to 3D may be one example of that shown in FIG. 2B-0 or 2B-1.

Figure 3A:
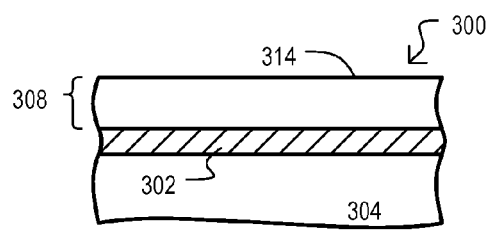
FIGS. 3A to 3D are side cross sectional views showing a method of modifying an ion conductor layer according to one embodiment.

FIG. 3A shows an arrangement like that of FIG. 2A, including a first electrode 302 formed on an underlying layer 304, as well as an ion conductor layer 308. Such items may be the same as, and subject to the same variation as, like items shown in FIG. 2A.

Figure 3B:
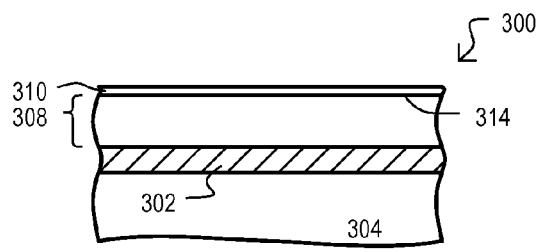

FIG. 3B shows the formation of a limiting layer 310 formed on a surface of ion conductor layer 308. In one embodiment, a limiting layer 310 may be an inhibiting layer that may inhibit incorporation of conductive ions into an ion conductor layer 308 through a surface 314 (in this case, a top surface). In particular embodiments, a limiting layer 310 may be a deposited layer. As but a few examples, a limiting layer 310 may include any of silicon nitride, silicon oxynitride, silicon dioxide, or combinations thereof. A limiting layer 310 may completely cover a surface 314 (i.e., is a contiguous layer), or may only partially cover a surface (i.e., is not continuous).

A limiting layer may be formed according to various deposition techniques, including but not limited to plasma enhanced chemical vapor deposition (PECVD), metalorganic chemical vapor deposition (MOCVD), and/or atomic layer deposition (ALD).

In addition or alternatively, a limiting layer 310 may be a grown layer such as one formed by oxidizing a surface of an ion conductor layer 308. Such a layer may also be contiguous or not contiguous.

A limiting layer 310 may be formed from a material that may allow conductive ions to pass therethrough. In some examples, a limiting layer 310 may be formed from a material that may prevent ions from passing through if too thick, but is thin enough to allow such actions to occur.

Figure 3C:
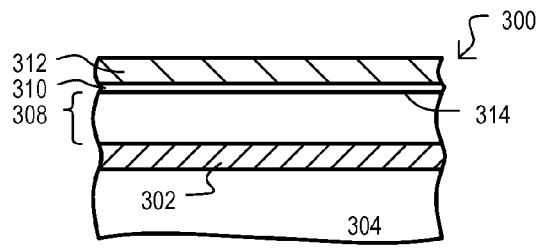

Referring to FIG. 3C, an ion source layer 312 may be formed. As shown, a limiting layer 310 may be situated between ion source layer 312 and ion conductor layer 308. Thus, a rate at which conductive ions may be incorporated into an ion conductor layer 308 may be slowed as compared to an arrangement in which an ion source layer 312 has a direct and uninterrupted contact with an ion conductor layer. In very particular embodiments, an ion source layer 312 may be retained as all or a portion of an active (or oxidizable) electrode.

Figure 3D:
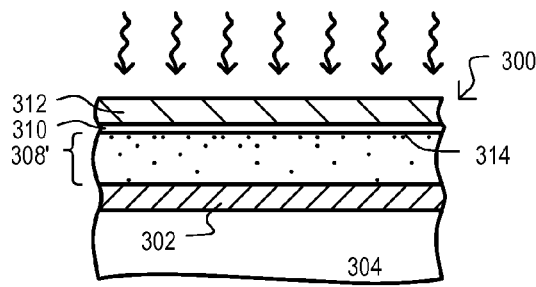

FIG. 3D shows an incorporation step. A light and/or heat treatment can cause conductive ions from ion source layer 312 to be incorporated into ion conductor layer 308 by passing through limiting layer 310. Due to limiting layer 310, ions may be incorporated into an ion conductor layer at a slower rate as compared to an arrangement lacking a limiting layer. This may allow for more control in electrical properties (e.g., program/erase resistances, thresholds, times) of a resulting CBRAM device incorporating such a stack.

In this way, an incorporation inhibiting layer may be included between an ion source and an ion conductor layer to slow the rate at which ions may be incorporated into the ion conductor layer.

Referring now to FIGS. 4A to 4D, a method for forming a CBRAM stack structure according to another embodiment is shown in a series of side cross sectional views. The embodiment shown may be an implementation of that shown in FIG. 2B-3.

Figure 4A:
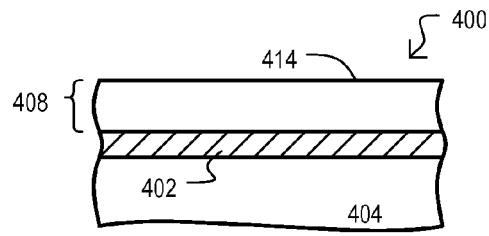
FIGS. 4A to 4D are side cross sectional views showing a method of modifying an ion conductor layer according to another embodiment.

FIG. 4A shows an arrangement like that of FIG. 2A, including a first electrode 402, underlying layer 404, and ion conductor layer 408. Such items may be the same as, and subject to the same variation as, like items shown in FIG. 2A.

Figure 4B:
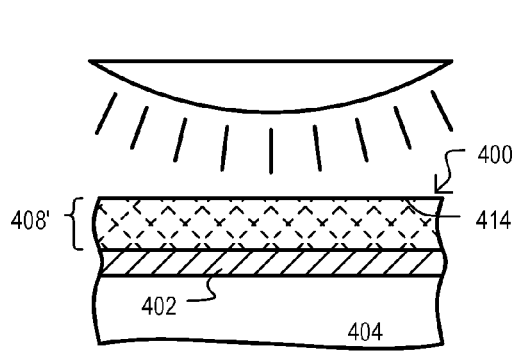

Referring to FIG. 4B, substantially an entire exposed ion conductor layer 408 may be subject to a treatment that alters ion incorporation properties of an ion conductor layer 408. In one particular example, an ion conductor layer may be densified. A densified ion conductor layer 408' may slow a rate at which ions travel into a densified ion conductor layer 408', as compared to a non-densified ion conductor layer.

In particular embodiments, a densification step may include a temperature cycle. In a very particular embodiment, a CBRAM structure 400 may have a $GeS_2$ based ion conductor layer heated up to a temperature in a range of about 200 to 400° C. and then cooled.

Figure 4C:
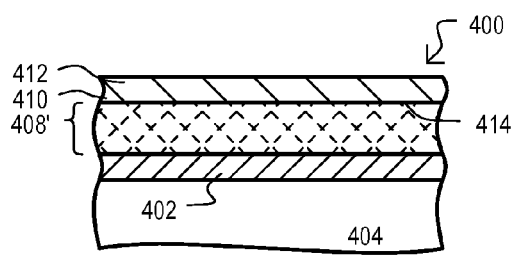

FIG. 4C shows the formation of an ion source layer 412. An ion source layer 412 may be formed on a surface 414 of a densified ion conductor layer 408'. In very particular embodiments, an ion source layer 412 may be retained as all or a portion of an active (or oxidizable) electrode.

Figure 4D:
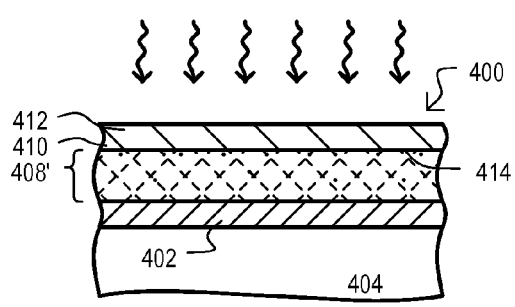

FIG. 4D shows an incorporation step. A light and/or heat treatment can cause conductive ions from ion source layer 412 to be incorporated into densified ion conductor layer 408'. Because ion conductor 408' is densified, a rate at which conductive ions are incorporated into the layer may be slower than an un-densified layer. This may allow for more control in electrical properties (e.g., program/erase resistances, thresholds, times) of a CBRAM device.

In this way, a density of substantially all of an ion conductor layer may be increased to control a rate at which ions may be incorporated into the ion conductor layer.

Referring now to FIGS. 5A to 5D, a method for forming a CBRAM stack structure according to yet another embodiment is shown in a series of side cross sectional views. The embodiment of FIGS. 5A to 5D may be another example of that shown in FIG. 2B-3.

Figure 5A:
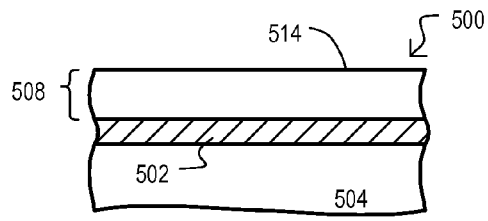
FIGS. 5A to 5D are side cross sectional views showing a method of modifying an ion conductor layer according to a further embodiment.

FIG. 5A shows an arrangement like that of FIG. 2A, including a first electrode 502, underlying layer 502, and ion conductor layer 508. Such items may be the same as, and subject to the same variation as, like items shown in FIG. 2A.

Figure 5B:
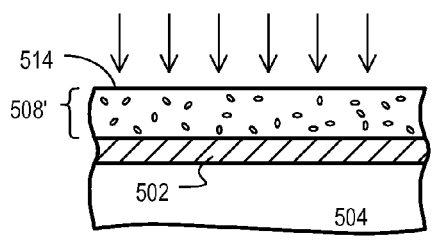

Referring to FIG. 5B, as the case of FIG. 4B, substantially all of an exposed ion conductor layer 508 may be treated. In this particular example, a density of an ion conductor layer may be lowered. A less dense ion conductor layer 508' may increase a rate at which conductive ions are incorporated into an ion conductor layer 508', as compared to an unmodified ion conductor layer.

In one very particular embodiment, a density reducing step may include ion implanting one or more elements into an ion conductor layer. For example, one or more ions having an atomic weight less than elements that make up an ion conductor layer. In one very particular embodiment, an ion conductor layer may be a Ge—S combination (e.g., $GeS_2$), and a density lowering step may implant oxygen, nitrogen, or both into such a layer.

Figure 5C:
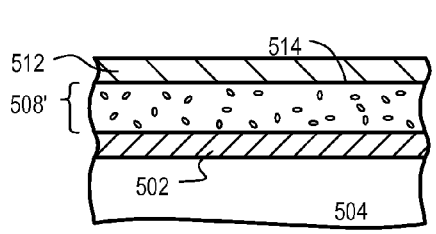

FIG. 5C shows the formation of an ion source layer 512. An ion source layer 512 may be formed on a surface 514 of a lower density ion conductor layer 508'. In very particular embodiments, an ion source layer 512 may be retained as all or a portion of an active (or oxidizable) electrode.

Figure 5D:
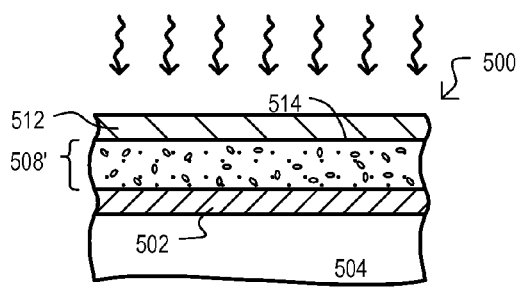

FIG. 5D shows an incorporation step. A light and/or heat treatment can cause conductive ions from ion source layer 512 to be incorporated into ion conductor layer. Because ion conductor 508' has a reduced density, a rate at which conductive ions are incorporated into the layer may be increased.

This may allow for creation of an ion conductor layer with a lower thermal budget than ion conductors without such a reduction in density.

In this way, a density of substantially all of an ion conductor layer may be decreased to control a rate at which ions may be incorporated into the ion conductor layer.

Figure 6A:
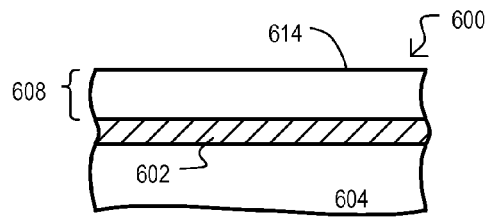
FIGS. 6A to 6C are side cross sectional views showing a method of modifying an ion conductor layer according to yet another embodiment.
Figure 6B:
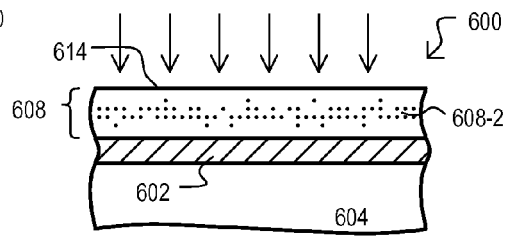
Figure 6C:
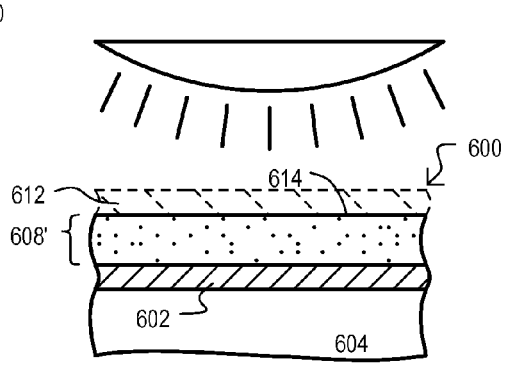

Referring now to FIGS. 6A to 6C, still another method for forming a CBRAM stack structure according to an embodiment is shown in a series of side cross sectional views. The embodiment of FIGS. 6A to 6C may be another example of that shown in FIG. 2B-2.

FIG. 6A shows an arrangement like that of FIG. 2A, including a first electrode 602, underlying layer 602, and ion conductor layer 608. Such items may be the same as, and subject to the same variation as, like items shown in FIG. 2A.

FIG. 6B shows an embodiment in which a portion of an ion conductor layer 608 may be treated. In this particular embodiment, conductive ions may be implanted into an intermediate portion 608-2 of ion conductor layer 608. By initially locating conductive ions within an intermediate portion 608-2 of an ion conductor layer, an amount of time for dispersing ions throughout an ion conductor 608 may be less, as compare to approaches that may incorporate ions from one surface of an ion conductor. Alternatively, a concentration profile of conductive ions may be maximized within an internal region of an ion conductor, which may not be possible, or may be difficult to achieve with single surface incorporation approaches.

In a particular embodiment, a high current ion implantation step may implant an active metal into an ion conductor layer. Even more particularly, an implanted element may include silver or copper for a $GeS_2$ ion conductor material. One skilled in the art would recognize that implantation energies and concentration of such an ion implantation step would vary according to ion conductor film thickness, desired concentration, and any subsequent anneal and/or incorporation inducing steps.

FIG. 6C shows an incorporation step. A light and/or heat treatment can cause implanted conductive ions within intermediate section 608-2 to disperse outward into ion conductor layer. Optionally, an ion source layer 612 may be formed prior to such an incorporation step, to enable ions to be incorporated from surface 614 as well from intermediate section 608-2.

In this way, conductive ions may be initially placed within a portion of an ion conductor layer prior to an incorporation step that spreads such conductive ions throughout an ion conductor layer.

The embodiments of FIGS. 2A to 6C show CBRAM stack arrangements in which an ion source layer may be formed on a top surface of a CBRAM stack, alternate embodiments may include an ion conductor layer formed over an ion source layer (e.g., an active electrode). In such arrangements, a bottom electrode may be an active electrode. One such embodiment is shown in FIGS. 7A to 7D.

Figure 7A:
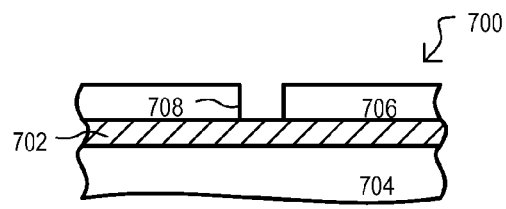
FIGS. 7A to 7E are side cross sectional views showing a method of forming a conductive bridging memory cell according to an embodiment.

Referring to FIG. 7A, a conductive layer 702 may be formed on an underlying layer 704. A conductive layer 702 may be formed by one or more indifferent conductive materials. That is, such materials may not be a source of conductive ions for incorporation into an ion conductor layer. A dielectric layer 706 may be formed over conductive layer 702. An opening 708 may be formed in the dielectric layer 706 that exposes conductive layer 702, and forms a location of CBRAM type cell.

Figure 7B:
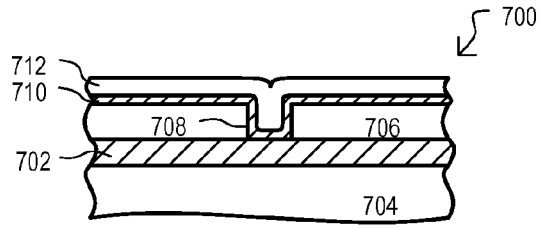

Referring to FIG. 7B, an ion source layer 710 may be formed over dielectric layer 706 and into opening 708. Ion source layer 710 may be in contact with conductive layer 702.

An ion source layer 710 may be formed form a metal, metal alloy, or metal compound that may provide conductive ions for incorporation into an ion conductor. FIG. 7B shows the formation of an ion conductor layer 712 formed over ion source layer 710. In a very particular embodiment, an ion conductor layer 712 may include $GeS_2$ and an ion source layer 710 may include silver or copper.

Figure 7C:
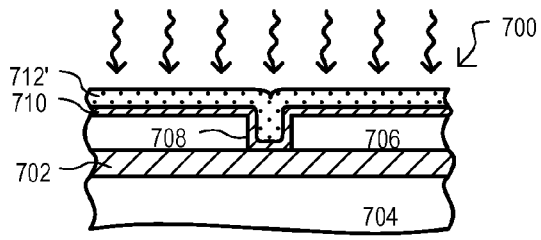

FIG. 7C shows an incorporation step. CBRAM cell stack 700 may be subject to a light treatment (e.g., UV light) and/or a heat treatment that may result in ions from ion source layer 710 being incorporated into ion conductor layer 712. Ion conductor layer 712' may thus be modified to function as a programmable impedance material.

Figure 7D:
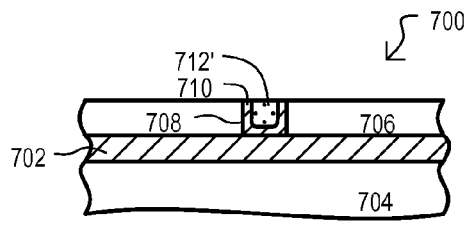

FIG. 7D shows a planarization step. Portions of ion source layer 710 and ion conductor layer 712 above dielectric layer 706 may be removed. As but one example, chemical mechanical polishing (CMP) may be used for such a planarization step.

It is understood that techniques shown in FIGS. 1 to 6C may be utilized, where practicable, to control a rate at which conductive ions may be incorporated into an ion conductor layer.

Figure 7E:
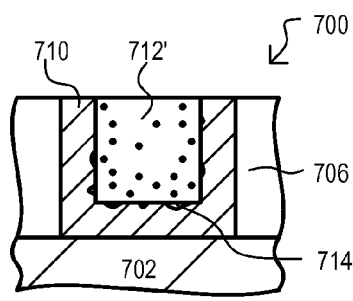

Referring now to FIG. 7E, a very particular example of a CBRAM stack like that shown in FIG. 7D is shown in a magnified view. FIG. 7E shows how in some cases, when subject to an incorporation step (e.g., FIG. 7C), as conductive ions travel from an ion source layer 710 into ion conductor layer 712, voids (one shown as 714) may arise at an interface region. Such voids undesirably affect the properties of a resulting CBRAM stack.

Referring now to FIGS. 8A to 8E, a method and device according to another embodiment is shown in a series of side cross sectional views. Such a method may be implemented alone, or in combination with other methods described herein.

Referring to FIG. 8A, the formation of a CBRAM cell stack structure 800 may include forming an underlying layer 802, conductive layer 804, and an interlayer dielectric (ILD) 806. Conductive layer 804 may be formed on underlying layer 802, and ILD 806 may be formed on conductive layer 804. An opening 808 may be formed through ILD 806 to expose a portion of conductive layer 804.

In very particular embodiments, an underlying layer 802 may be a dielectric layer formed over a semiconductor substrate that includes active devices, such as transistors, for example. Such an underlying layer may be selected of a material suitable for a selected process, and may include, as but a few examples, any of: silicon dioxide (including doped versions such as PSG and BPSG), silicon nitride, silicon oxynitride, a "low-k" dielectric material and/or combinations of such layers.

Conductive layer 804 may provide a conductive connection between one electrode of a resistive memory cell stack and other portions of an integrated circuit device. A conductive layer 804 may be formed from a material suitable for a given overall manufacturing process, and may include, materials that do not contribute conductive ions for a CBRAM ion conductor layer (i.e., "indifferent" electrode materials). As but a few examples, a conductive layer 804 may include, but is not limited to, aluminum, tantalum, or tantalum nitride.

An ILD layer 806 may be another dielectric layer selected of a material suitable for a selected process, and may include, materials such as those dielectric materials noted above as examples of underlying layer 802.

Referring to FIG. 8B, a first electrode layer 810 may be formed over ILD 806 and extend into opening 808 to make a conductive connection with conductive layer 804. A memory material 812 may be formed over first electrode layer 810, and also may extend into opening 808. A sacrificial layer 814 may be formed over memory material 812.

Both first electrode layer 810 and sacrificial layer 814 may be formed from materials that may modify a memory material when subject to a suitable treatment. As but one example, a memory material 812 may be an ion conductor, and a first electrode layer 810 may form an active electrode, and thus may be a material that may introduce conductive ions into memory material 812 (e.g., an ion source material). In one very particular embodiment, a first electrode layer 810 may include, or be formed of, silver or copper, while a memory material 812 may be formed from a germanium-sulfur combination. In such a particular embodiment, a sacrificial layer 814 may also be a source of conductive ions, particularly the same ions as first electrode layer 810, even more particularly, a sacrificial layer 814 may be the same material as first electrode layer 810.

FIG. 8C shows a CBRAM stack being subject to a treatment that may alter a property of memory material 812 as a result of both a first electrode layer 810 and sacrificial layer 814.

In one embodiment, both first electrode layer 810 and sacrificial layer 814 may be conductive ion source layers, and a treatment may be an incorporation step that causes conductive ions to be incorporated into an ion conductor layer from both layers 814 and 810. In a particular embodiment, a sacrificial layer 814 may be formed to be the predominant source of a conductive ion material, as opposed to first electrode layer 810. In one embodiment, a thickness of sacrificial layer 814 may be different from that of first electrode layer 810 to thereby enable the sacrificial layer 814 to be the predominant source of an ion conducting material. In other embodiments, a limiting layer, like that described above in FIGS. 3A to 3D, may be disposed between a first electrode layer 810 and memory material 812, while such a layer may not be included between sacrificial layer 814 and memory material 812.

An incorporation step like that of FIG. 8C may enable a more uniform gradient of conductive ions within an ion conductor, and/or result in a first electrode layer 810 sourcing less conductive ion material than approaches such as that shown in FIGS. 7A to 7E. A treatment step may be a light exposure treatment (including UV light) or rapid heat treatment, or some combination thereof. Following such a step, a memory material may be a modified memory material 812'.

Referring to FIG. 8D, a sacrificial layer 814 may be removed. Such a step may remove a sacrificial layer 814 and expose a modified memory material 812'. A removal step may be a planarization step, such as chemical mechanical polishing and/or an etch back step. In the very particular embodiment of FIG. 8D, a sacrificial layer removal step may remove sacrificial layer 814 and modified memory material 812' formed above ILD 806, leaving material within opening 808.

FIG. 8E is a magnified view of a CBRAM stack that may result from steps shown in FIGS. 8A to 8D. Through use of a sacrificial layer 814, an interface between modified memory material 812' and first electrode layer 804 may have fewer, or no voids, unlike the arrangement shown in FIG. 7E.

A second electrode layer (not shown) may be formed over the structure shown FIG. 8D/E having a conductive connection to a modified memory material 812'. Such a second electrode layer may make direct contact with modified memory material 812' or may make contact via one or more intervening layers.

In this way, a sacrificial layer may be utilized to create a CBRAM memory stack with a memory material having a more uniform distribution of conductive ions and/or an active electrode with fewer or no voids.

Referring now to FIGS. 9A to 9D, a method and device according to a further embodiment is shown in a series of side cross sectional views.

FIGS. 9A to 9D may generally follow those steps and structures shown in FIGS. 8A to 8D, and thus may include the same materials, steps, and variations of the embodiment shown in FIGS. 8A to 8D.

FIGS. 9A to 9D may differ from FIGS. 8A to 8D in that a barrier layer 916 may be formed between first electrode layer 910 and underlying layers. A barrier layer 916 may serve to prevent species, such as ions, originating from a first electrode layer 910 and/or any subsequently formed layers, from propagating to structures below (e.g., transistors). Accordingly, a barrier layer 916 may have a significantly lower propagation rate/tendency for the undesirable species when compared to underlying layers, such as 902. In a very particular embodiment, inclusion of barrier layer 916 may enable an underlying conductive layer 904 to include conductive ion species.

It is noted that a barrier layer 916 may prevent propagation of undesirable species at substantially all anticipated temperatures (including subsequent manufacturing process cycles), or may be a temperature dependent barrier layer (i.e., mobility rates of undesirable species varies according to temperature).

Figure 9A:
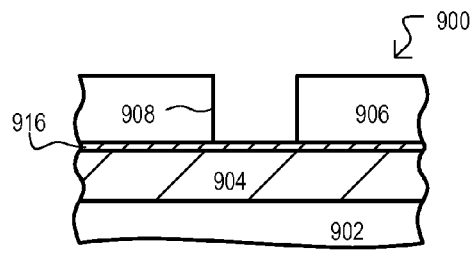
FIGS. 9A to 9D are side cross sectional views showing a method of forming a conductive bridging memory cell having a conductive ion barrier layer according to an embodiment.

FIG. 9A shows an initial structure of a CBRAM cell stack 900. A barrier layer 916 may be formed on conductive layer 904. In such an arrangement, a barrier layer 916 may be a conductive layer. In very particular embodiments, a barrier layer may include titanium, titanium nitride, tantalum, tungsten or some combination thereof.

Figure 9B:
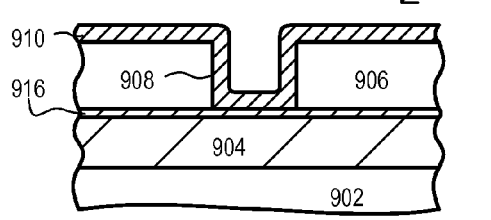

FIG. 9B shows first electrode layer 910 formed within opening 908 and in conductive connection with conductive layer 904 via barrier layer 916.

Figure 9C:
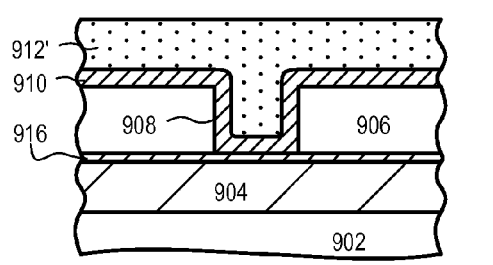

FIG. 9C shows a modified memory material 912' formed within opening 908. A modified memory material 912' may be formed with a sacrificial layer, as noted in the embodiment of FIGS. 8A to 8E, or may be formed in the manner shown in FIGS. 7A to 7E.

Figure 9D:
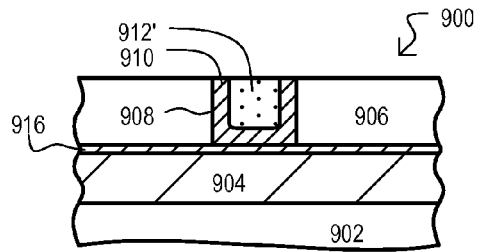

FIG. 9D shows a CBRAM cell stack 900 following a planarization step.

As in the case of FIGS. 8A to 8E, a second electrode layer (not shown) may be formed over the structure shown FIG. 9D having a conductive connection to modified memory material 912'.

In this way, a barrier layer may be utilized to reduce the diffusion of CBRAM cell stack elements into other portions of an integrated circuit and/or enable underlying electrodes to be formed with conductive ion materials (e.g., active electrode type materials).

Referring now to FIGS. 10A to 10D, a method and device according to yet another embodiment is shown in a series of side cross sectional views.

FIGS. 10A to 10D may generally follow those steps and structures shown in FIGS. 8A to 8D, and thus may include the same materials, steps, and variations of this previous embodiment.

FIGS. 10A to 10D may differ from FIGS. 8A to 8D in that surrounding barrier layers 1016-0 and 1016-1 may be formed between a first electrode layer 1010 and underlying layers. Barrier layers 1016-0/1 may serve to prevent species present in a CBRAM cell from propagating to lower layers. In addition or alternatively, such barrier layers 1016-0/1 may enable lower layers to be formed with species that may undesirably function as conductive ions in a CBRAM cell.

In some embodiments, barrier layers 1016-0/1 may be formed from the same materials as, and subject to the same variation as barrier layer 916 of FIGS. 9A to 9D. However, as will be described in more detail below, if a second barrier layer 1016-1 is removed from a bottom of opening 1008, a second barrier layer 1016-1 may not be a formed from a conductive material.

Figure 10A:
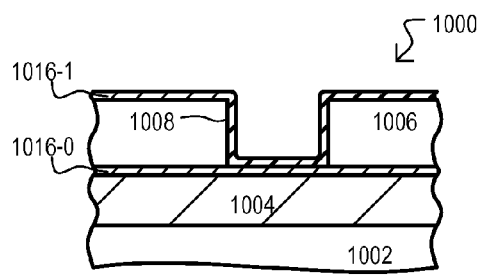
FIGS. 10A to 10D are side cross sectional views showing a method of forming a conductive bridging memory cell having a conductive ion barrier layer according to another embodiment.

FIG. 10A shows an initial structure of a CBRAM cell stack 1000. A first barrier layer 1016-0 may be formed on conductive layer 1004. A second barrier layer 1016-1 may be formed in opening 1008, including on sides of the opening.

Figure 10B:
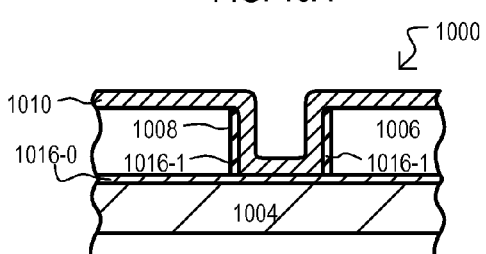

FIG. 10B shows memory cell stack structure 1000 after a second barrier layer 1016-1 has been removed from a top surface of ILD 1006. In the very particular embodiment shown, a second barrier layer 1016-1 may also be removed from a bottom of opening 1008, thus exposing first barrier layer 1016-0. However, in other embodiments, a second barrier layer 1016-1 may be retained within a bottom of opening, or alternatively, second barrier layer 1016-1 and a portion or all of first barrier layer 1016-0 may be removed.

In one embodiment, portions of a second barrier layer material 1016-1 may be removed with an anisotropic etch step having a high selectivity between a second barrier layer material 1016-1 and ILD 1006. FIG. 10B also shows first electrode layer 1010 formed within opening 1008 and in conductive connection with conductive layer 1004.

As noted above, if a second barrier layer 1016-1 is removed from a bottom of opening 1008, a second barrier layer 1016-1 may be non-conductive, or have a relatively high resistance. Similarly, if a first barrier layer 1016-0 is removed from a bottom of opening 1008, a first barrier layer 1016-0 may also be non-conductive, or have a relatively high resistance. Conversely, if either such layer is retained within a bottom of opening 1008, such a layer may not be an insulator, to ensure a conductive connection can be made with conductive layer 1004.

Figure 10C:
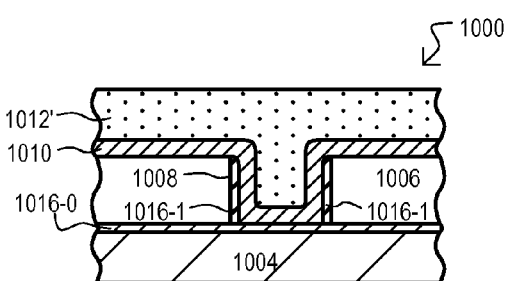

FIG. 10C shows a modified memory material 1012' formed within opening 1008. In particular embodiments, such a step may include incorporating conductive ions into an ion conductor material according to embodiments described herein, and equivalents.

Figure 10D:
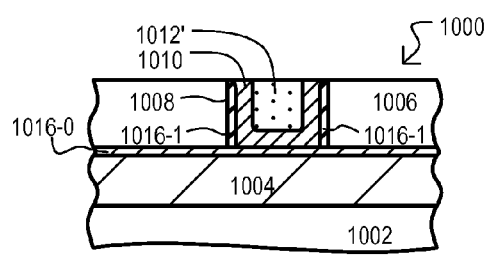

Referring to FIG. 10D, a planarization step may remove portions of a modified memory material 1012' to expose a top surface of ILD 1006.

A second electrode layer (not shown) may be formed over the structure shown FIG. 10D.

In this way, one or more barrier layers may be utilized to reduce or eliminate the migration of CBRAM stack species in vertical and/or horizontal directions, and/or prevent the migration of unwanted species into a CBRAM cell stack.

Referring now to FIGS. 11A to 11I, a method and device according to yet another embodiment is shown in a series of side cross sectional views.

Figure 11A:
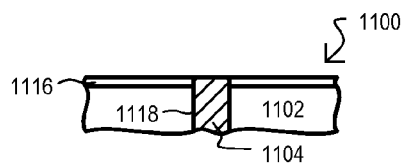
FIGS. 11A to 11I are side cross sectional views showing a method of forming a conductive bridging memory cell having a conductive ion barrier layer according to a further embodiment.

FIG. 11A shows a CBRAM memory cell stack structure 1100 following the formation of a conductive layer 1104 and barrier layer 1116. In the particular embodiment shown, a conductor opening 1118 may be formed through underlying layer 1102 and barrier layer 1116. A conductive layer 1104 may be formed within conductor opening 1118. A conductive layer 1104 may be, or include, a via or "plug" structure, such as that utilized to form vertical contacts and/or vias to interconnect conductive layers on different planes.

In one particular embodiment, an underlying layer 1102 and barrier layer 1116 may be formed. A pattern and etch step may then create a conductor opening 1118. A suitable deposition process may form a conductive material within conductor opening 1118. A planarization step may then remove material formed over barrier layer 1116. A planarization step may include a CMP step and/or an etchback step. Further, in particular embodiments, a barrier layer 1116 may serve as an etch/CMP stop layer in such a planarization step.

Barrier layer 1116 may serve to prevent contaminants, such as ions, generated from subsequently formed memory cell stack materials from propagating to structures below. In addition or alternatively, barrier layer 1116 may prevent unwanted species present in lower layer from propagating into CBRAM stack layers. In particular embodiments, a second barrier layer 1116 may not be a conductive material.

Figure 11B:
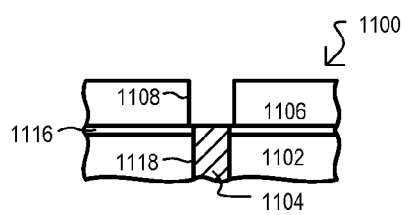

FIG. 11B shows a CBRAM cell stack 1100 following the formation of an ILD 1106. An opening 1108 may be created through ILD 1106 that may expose conductive layer 1104.

Figure 11F:
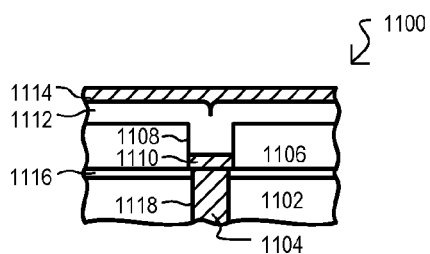
Figure 11C:
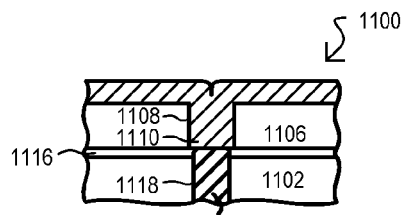

FIG. 11C shows a CBRAM cell stack 1100 following the formation of a first electrode layer 1110. A first electrode layer 1110 may be formed within opening 1108, and in the particular example shown, may extend on a top surface of an ILD 1106. A first electrode layer 1110 may be an active electrode, and thus may be a conductive ion source.

Figure 11G:
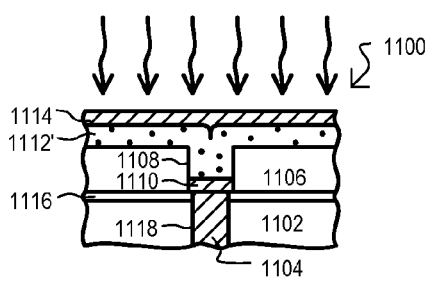
Figure 11D:
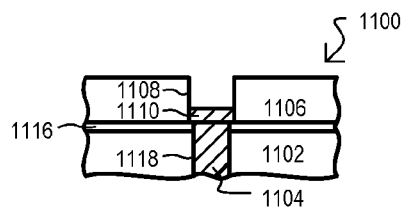

FIG. 11D shows a CBRAM cell stack 1100 following a partial removal of a first electrode layer 1110. Such a step may remove first electrode layer material, except at a bottom portion of an opening 1108. Such a step may include a partial etch back step.

Figure 11H:
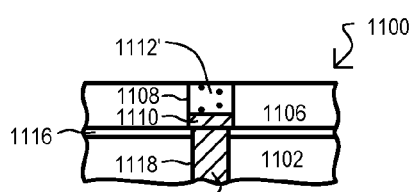
Figure 11E:
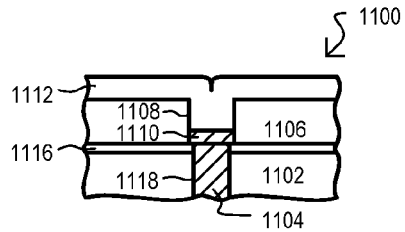

FIG. 11E shows the formation of a memory material 1112. Memory material 1112 may extend over and into opening 1108. Memory material 1112 may be formed from, and subject to, the same variations of memory materials noted in other embodiments herein, and equivalents.

FIG. 11F shows the formation of a sacrificial layer 1114 over a memory material 1112. Sacrificial layer 1114 may be formed from, and subject to the same variations of sacrificial materials noted for other embodiments herein, and equivalents. That is, a sacrificial layer 1114 may be a conductive ion source.

FIG. 11G shows a treatment step that may alter a property of memory material 1112 as a result of species being incorporated from a first electrode layer 1110 and sacrificial layer 1114. Such a step can include those treatments noted herein for other embodiments, or equivalents.

FIG. 11H shows a CBRAM cell stack 1100 following a planarization step. A sacrificial layer 1114 may be removed. In the particular embodiment shown, modified memory material 1112' on a top surface of ILD 1106 may be removed, leaving first electrode layer 1110 and modified memory material 1112' within opening 1108.

Figure 11I:
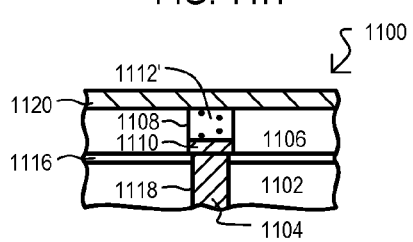

FIG. 11I shows a CBRAM memory cell stack following the formation of a second electrode layer 1120. A second electrode layer 1120 may be formed over and have a conductive connection to modified memory material 1112'.

In this way, a CBRAM cell stack may include a bottom electrode layer formed by a subtractive damascene process.

Referring now to FIGS. 12A to 12H, a method and device according to yet another embodiment is shown in a series of side cross sectional views. FIGS. 12A to 12H show an embodiment having a planar CBRAM cell structure.

Figure 12A:
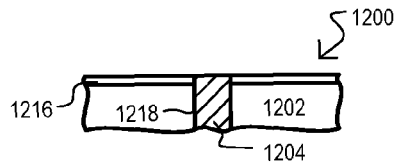
FIGS. 12A to 12H are side cross sectional views showing a method of forming a conductive bridging memory cell having a conductive ion barrier layer according to a further embodiment.

FIG. 12A shows a CBRAM cell stack structure 1200 following steps like that described for FIG. 11A, above.

Figure 12B:
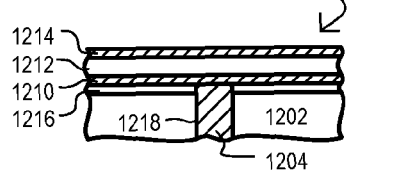

FIG. 12B shows a CBRAM memory cell stack structure 1200 following the formation of a first electrode layer 1210, a memory material 1212, and a sacrificial layer 1214. In the embodiment shown, such layers may be formed one on top of another, with first electrode layer 1210 in contact with conductive layer 1204. Such layers may be formed from, and subject to the same variations of materials noted for other embodiments herein, and equivalents. However, unlike other embodiments described above, layers 1210, 1212 and 1214 may not be formed within an opening created in an ILD, and instead may all be substantially planar.

Figure 12C:
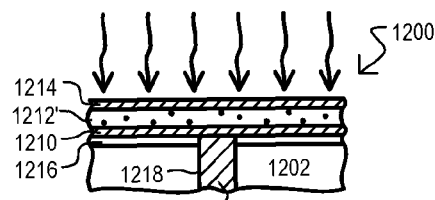

FIG. 12C shows a treatment step that may alter a property of memory material 1212 as a result of incorporation of materials both a first electrode layer 1210 and sacrificial layer 1214. Such a step can include suitable treatments noted herein for other embodiments, or equivalents.

Figure 12D:
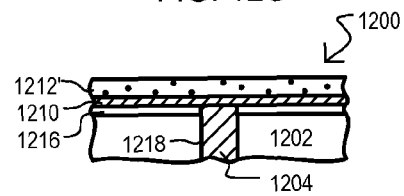

FIG. 12D shows a CBRAM cell stack 1200 following a planarization step. A sacrificial layer 1214 may be removed. Unlike other embodiments shown above, both a first electrode layer 1210 and modified CBRAM memory material 1212' may remain on a barrier layer 1216.

Figure 12E:
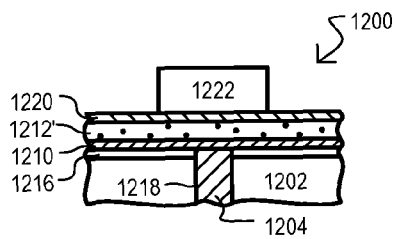

FIG. 12E shows a CBRAM cell structure 1200 following the formation of a second electrode layer 1220 and a stack etch mask 1222. A second electrode layer 1220 may form an "indifferent" electrode, and in the particular embodiment shown, may be in direct contact with modified memory cell 1212' material. A stack etch mask 1222 may be an etch mask that may define the limits of a CBRAM cell structure. In the embodiment shown, etch mask 1222 may defines the extents of a CBRAM cell stack in a lateral direction (i.e., direction parallel to a surface of an integrated circuit).

Figure 12F:
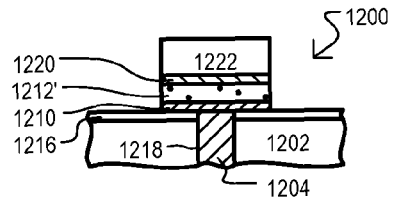

FIG. 12F shows a CBRAM memory cell structure 1200 following an etch step. Such an etch step may removes portion of first electrode layer 1210, modified CBRAM memory material 1212', and second electrode layer 1220 not covered by etch mask 1222. In one particular embodiment, a barrier layer 1216 may serve as an etch mask for such a patterning step.

Figure 12G:
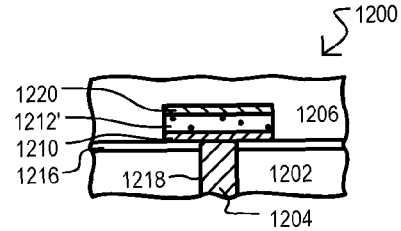

FIG. 12G shows a CBRAM cell structure 1200 following the removal of etch mask 1222 and the formation of an ILD 1206. An ILD 1206 may be formed from any suitable ILD materials described herein, and equivalents.

Figure 12H:
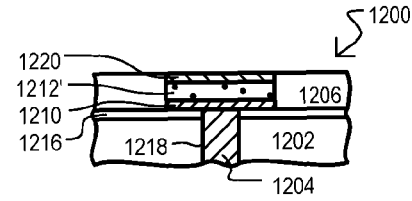

FIG. 12H shows a CBRAM memory cell structure 1200 following a second electrode exposure step. Such a step may remove ILD 1206 to expose a second electrode layer 1220. In the very particular embodiment shown, such a step may include a planarization step, including but not limited to CMP and/or an etch back step. However, alternate embodiments may create an opening through ILD 1206 to expose a top surface of second electrode layer 1220.

In this way, a CBRAM memory cell stack may be formed by an etch patterning step.

Figure 13:
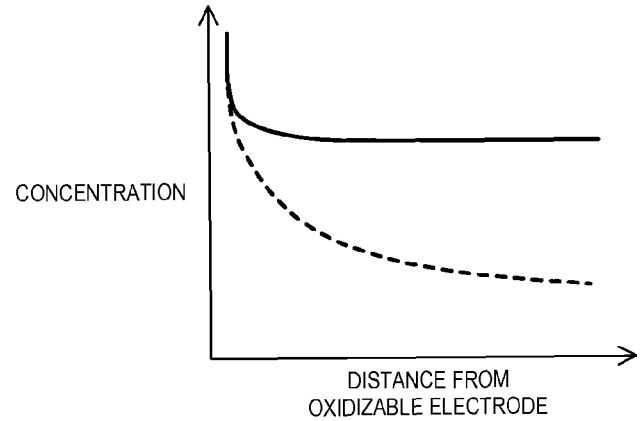
FIG. 13 is a graph showing concentration differences between single side and double side ion source incorporation into an ion conductor layer.

Referring now to FIG. 13, a graph shows a memory material profile according to one embodiment. FIG. 13 shows a concentration with respect to distance from a first (i.e., oxidizable) electrode layer. A solid line represents concentrations that may be achieved with embodiments shown herein that utilize a sacrificial layer (e.g., a sacrificial ion source material). Such a concentration is in contrast to that achieved by methods utilizing but one ion source electrode material, which is represented by a dashed line in FIG. 13.

In this way, a CBRAM may include a memory material modified by incorporating materials, such as conductive ions, from opposing sides of the memory material.

Embodiments described above have shown CBRAM structures having a memory layer that may have properties altered by the incorporation of other materials, such as conductive ions.

Various additional embodiments for forming such layers in CBRAM cells will now be described.

Figure 14A:
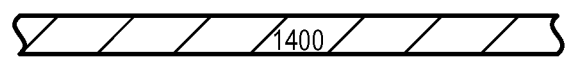
FIGS. 14A to 14C are side cross sectional views showing the fabrication of a conductive bridging memory cell according to an embodiment.
Figure 14B:
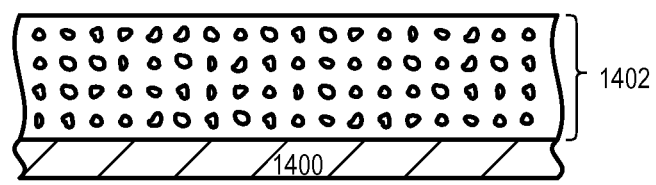
Figure 14C:
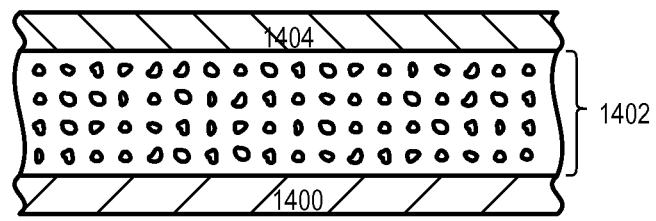

Referring now to FIGS. 14A to 14C, a method of forming CBRAM cells layers according to one particular embodiment is shown in a series of side cross sectional views.

FIG. 14A shows the formation of a first electrode 1400 formed from a conductive material.

FIG. 14B shows the formation of a memory material 1402. A memory material may be alterable to provide two or more different impedance states, including but not limited to changes in resistance, capacitance, or both. A memory material 1402 may be fabricated by altering layers of different materials to form a desired distribution of an active material. Such a distribution may vary an impedance response of a resulting CBRAM cell. In addition or alternatively, a memory material 1402 may be altered after being deposited, or barrier layers included within such a memory material 1402 to vary an impedance response of such a material, as described in embodiments above.

FIG. 14C shows the formation of a second electrode 1404 on an opposite side of the memory material 1402 with respect to first electrode 1400.

In a very particular embodiment, a memory material 1402 may be an ion conductor, and one of electrodes 1400 or 1404 may be an "active" electrode, while the other of the electrodes 1404 of 1400 may be an indifferent electrode.

In a very particular embodiment, an active electrode may be a bottom electrode 1400.

In this way, a CBRAM may have a bottom active electrode.

Referring now to FIG. 15, one example of a CBRAM cell 1500 is shown in a first state. A CBRAM cell 1500 may include a first electrode layer 1502, memory layer matrix 1504, and second electrode layer 1506. A first electrode layer 1502 and second electrode layer 1506 may be conductive materials for applying an electrical potential across memory layer matrix 1504.

In one particular embodiment, a bottom electrode layers 1502 may form all or part of an active electrode.

In a particular embodiment, a memory layer matrix 1504 may include an ion conductor material incorporated with a material suitable as a conductive ion for electrodeposit and electro-magnetic dissolution within the ion conductor. FIG. 15 shows a state in which a dissolution of conductive ions gives rise to a relatively high resistance between electrode layers (1502 and 1506). In this particular description, such a higher resistance state will be referred to as an erased state. In the very particular embodiment shown, an ion conductor material is represented as a collection of nanostructures, such as nanocrystals (one shown as 1508), distributed throughout the CBRAM matrix 1504.

Referring now to FIG. 16, the CBRAM cell 1500 of FIG. 15 is shown in a second state. Application of a first polarity voltage between electrode layers (1502 and 1506) that exceeds a threshold voltage may result in electrodepositing of conductive ions within memory layer matrix 1504. Consequently, a resistance through memory layer matrix 1504 may be reduced. In the very particular embodiment shown, a programmed state is represented by conduction paths (one shown as 1510) that may be formed by electrodepositing. It is understood that application of a second polarity voltage (opposite to that of the first polarity) may increase a resistance of CBRAM matrix 1504, and may return the CBRAM cell 1500 to the erased or similar state.

Controlling an incorporation profile of a conductive ion source material into an ion conductor may provide for advantageous CBRAM cell response, including more predictability or uniformity of a CBRAM cell threshold voltage and/or increased reliability of a CBRAM cell.

Referring now to FIGS. 17 and 18A to 18F, a method of forming a CBRAM cell according to embodiments will now be described. FIG. 17 is a flow diagram, and FIGS. 18A to 18F are side cross sectional views corresponding to the method of FIG. 17.

Referring to FIG. 17, a method 1700 may include forming a first electrode layer (step 1702). In one embodiment, a first electrode layer may be an active electrode. In an alternate embodiment, a first electrode may be an indifferent electrode. An ion conductor layer may then be formed over a first electrode layer (step 1704).

Figure 18A:
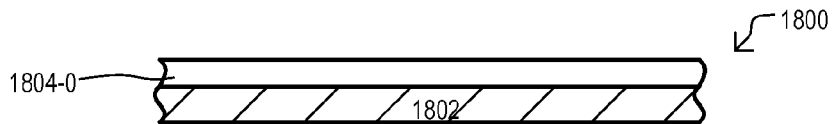
FIGS. 18A to 18F are side cross sectional views of one example of the method shown in FIG. 17.

One example of a CBRAM cell stack following a step 1704 is shown in FIG. 18A, which shows a first ion conductor layer 1804-0 on a first electrode layer 1802. While FIG. 18A shows ion conductor layer 1804-0 directly on a surface of first electrode layer 1802 other embodiments may include an intervening layer. In one very particular embodiment, a first ion conductor layer 1804-0 may include a combination of germanium and sulfur, which may or may not include stoichiometric $GeS_2$, as well as non-stoichiometric combinations of Ge and S.

An ion conductor layer may be formed by deposition, including but not limited to, chemical vapor deposition (CVD) technology, atomic layer deposition (ALD) technology, physical vapor deposition (PVD) technology, or any other suitable technology. A technology that provides the best thickness control of the layer is preferable.

Referring still to FIG. 17, a method 1700 may also include forming an active material layer (step 1706). An active material layer may provide a source of materials that may results in ion conductor layer forming a switching material. That is, a material having a property (e.g., impedance) that may change by application of a voltage or current. In one particular example, an active material can provide conductive ions for an ion conductor layer.

Figure 18B:
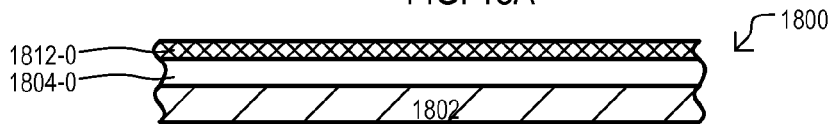

One example of a CBRAM stack following a step 1706 is shown in FIG. 18B, which shows a first active material layer 1812-0 on first ion conductor layer 1804-0. While FIG. 18B shows active material layer 1812-0 directly on a surface of first ion conductor layer 1804-0 other embodiments may include one or more intervening layer. In one very particular embodiment, a first active material layer 1804-0 may include silver (Ag) formed by a sputtering process.

If a desired thickness for a CBRAM matrix stack has not been reached, steps 1704 and 1706 may be repeated (N from step 1708).

Figure 18C:
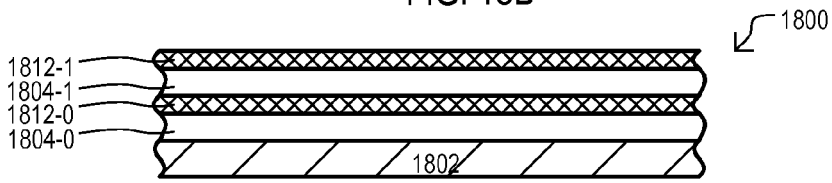

FIG. 18C shows a first iteration that may result in a second ion conductor layer 1804-1 and second active material layer 1812-1 being formed.

Figure 18D:
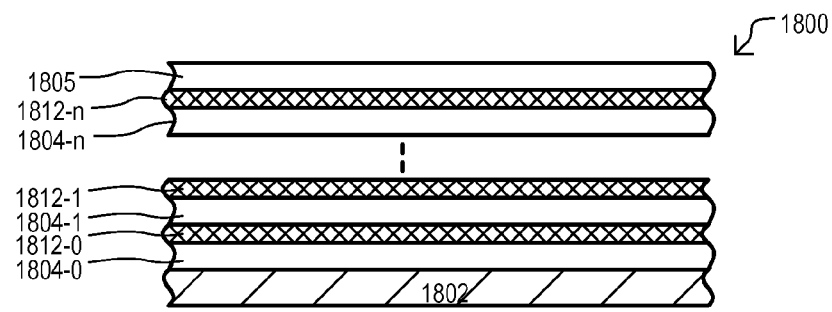

FIG. 18D shows a last iteration that may result in an ion conductor layer 1804-n and active material layer 1812-n being formed. In the very particular example shown, a capping layer of an ion conductor 1805 may also be formed.

As shown in FIG. 17, if a desired thickness for a CBRAM matrix stack has been reached (Y from 1708), a CBRAM stack may be subject to a rapid heat treatment (step 1710). A rapid heat treatment may result in the conductive ion material being incorporated into the ion conductor.

In some embodiments, a rapid heat treatment may include a rapid heating, and optionally, a quenching. In one embodiment, a heat treatment may occur in an inert gas environment, such as argon, or any other suitable environment. In some embodiments, the temperature during the heat treatment can range between 200° C. and 600° C., and may last between 1 second and 20-30 seconds. A rapid heat treatment, may include, as but a few of the many possible examples, a rapid thermal anneal, spike anneal, including laser spike anneal, or other suitable heat treatments.

In a particular embodiment, a rapid heat treatment may involve a ramping of a temperature between 10° C./second to 1000° C./second.

While some embodiments may perform a rapid heat treatment in an environment containing one or more inert gases, other embodiments may include an inert gas with a more reactive gas, such as nitrogen and/or oxygen.

In alternate embodiments, in which CBRAM stack layers may absorb thermal energy quickly, a high temperature treatment may not be required.

Figure 18E:
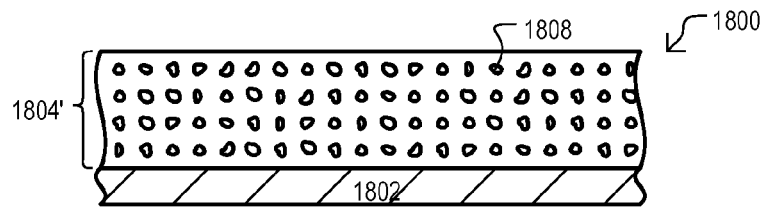

A CBRAM stack following such a heat treatment step according to one embodiment is shown in FIG. 18E. An ion conductor layer 1804' may now include conductive ion microstructures (one shown as 1108) incorporated throughout the layer.

Figure 18F:
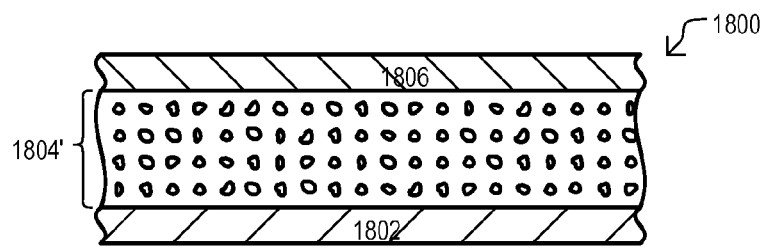

Referring still to FIG. 17, a second electrode layer may then be formed (step 1712). As a CBRAM stack according to one embodiment following such a step is shown in FIG. 18F. A second electrode layer 1806 may be formed on ion conductor layer 1804', opposite to first conductor layer 1802. In particular arrangements, if a first electrode layer 1802 forms an active electrode, a second electrode layer 1806 may form an indifferent electrode. Conversely, if a first electrode layer 1802 forms an indifferent electrode, a second electrode layer 1806 may form an active electrode.

As noted in embodiments above, an ion conductor layer may be formed by PVD technology. In a PVD process, one or more targets may be struck by an ion beam with a high energy ion beam device. In one embodiment, an ion conductor layer may be deposited using a combination target (i.e., a target composed of multiple elements). Even more particularly, a combination target may be a Ge—S target. A high energy ion beam device may sputter such a combination of elements onto a surface to thereby deposit an ion conductor layer. Typically, such a combination target may have a concentration of one element with respect to one another.

Figure 19A:
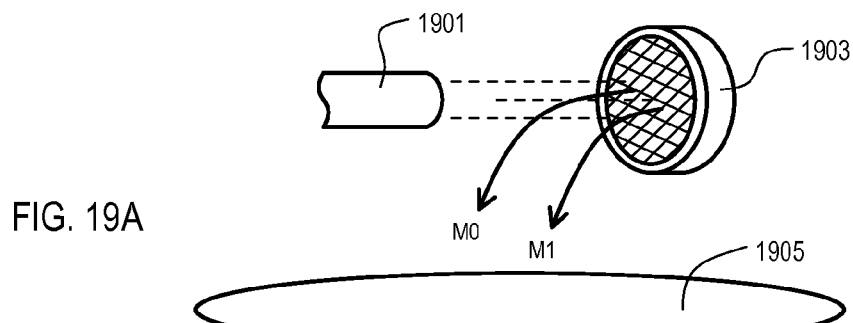
FIGS. 19A and 19B are diagrams showing physical vapor deposition steps according to embodiments.

A PVD system according to one particular embodiment is shown in FIG. 19A. FIG. 19A shows an ion beam source 1901, a combination target 1903, and substrate 1905. A combination target 1903 may be formed from two base materials (M0 and M1). A substrate 1905 may be a wafer on which integrated circuits may be formed. When struck by an ion beam from ion beam source, both materials (M0 and M1) may be deposited onto substrate 1905 to thereby form an ion conductor layer.

Figure 19B:
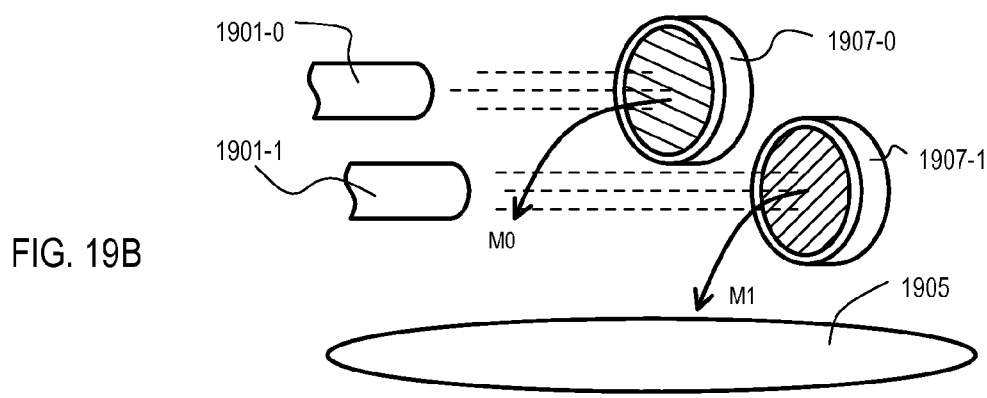

In other embodiments, an ion conductor layer may be deposited using separate targets. One particular embodiment having separate targets is shown in FIG. 19B. FIG. 19B shows ion beam sources 1901-0/1, uniform targets 1907-0/1, and a substrate 1905. Uniform targets 1907-0/1 may be formed of a same material, with target 1907-0 formed with base material M0 and target 1907-1 formed with a base material M1. In the arrangement shown, an ion beam source may sputters one target at a time or both targets concurrently onto the substrate (i.e., co-sputtering). Using separate targets may allow a user to control and determine composition of different particles.

While the embodiments of FIGS. 19A and 19B show a one and two target arrangement, other embodiments may include more than two elements.

In this way, a switching memory material of a CBRAM device may be formed by alternating ion conductor layers with active material layers.

Figure 20A:
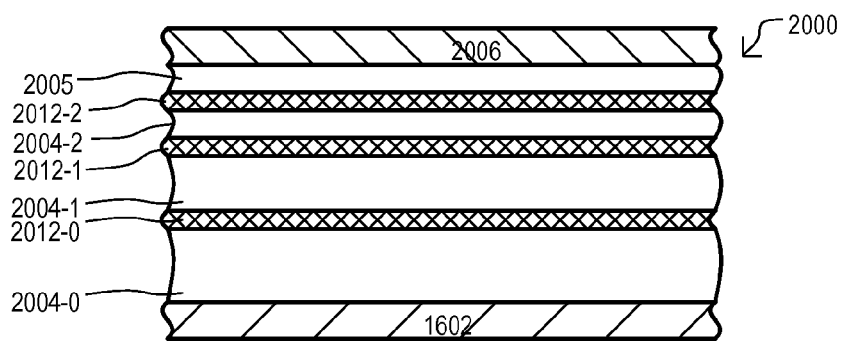
FIGS. 20A and 20B are side cross sectional views of another example of the method shown in FIG. 17.
Figure 20B:
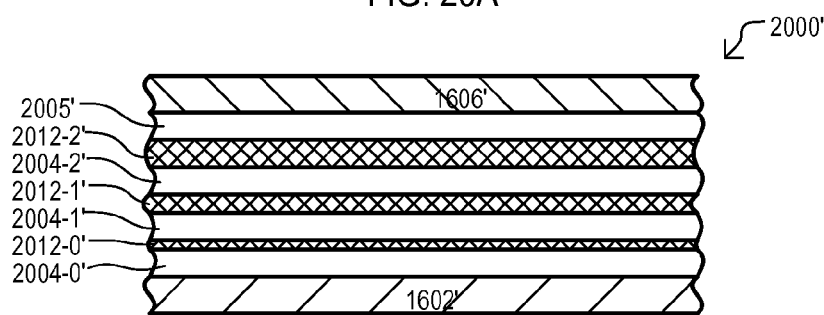

Referring now to FIGS. 20A and 20B, a formation of CBRAM stacks according alternate embodiments are shown in a series of cross sectional views. FIGS. 20A and 20B show a CBRAM stack prior to a conductive ion incorporation step (e.g., rapid heat treatment). While FIGS. 18A to 18F show an arrangement in which ion conductor layer and ion source layer thickness are repeated, in an alternate arrangement, a thickness of such layers may be varied.

FIG. 20A shows an CBRAM stack according to an embodiment in which ion conductor layers (2004-0 to -2) may have a varying thickness.

FIG. 20B shows an arrangement in which active material layers (2012-0 to -2') may have a varying thickness. In other embodiments, both ion conductor and active material layers may vary in thickness.

In a very particular embodiment, a stack may include a number "n" layers of Ag and n+1 layers of $GeS_2$, with $GeS_2$ layers capping opposing ends of the stack. As the number of layers (n/n+1) increases, a thickness of each layer may decrease. In particular, a ratio of total Ag thickness to total $GeS_2$ thickness may be maintained within a predetermined range. As but one very particular example, each Ag layer may have a thickness of about 1 to 30 nm, each $GeS_2$ layer may have a thickness of about 1 to 75 nm. A number of layers (n) may be between about 3 to 50. A ratio of total Ag thickness to $GeS_2$ thickness ($Ag:GeS_2$) may be in the range of about 1:1 to about 1:20.

In this way, a switching memory material of a CBRAM device may be formed by alternating ion conductor layers and active material layers, either of which may have a different thickness.

Figure 21:
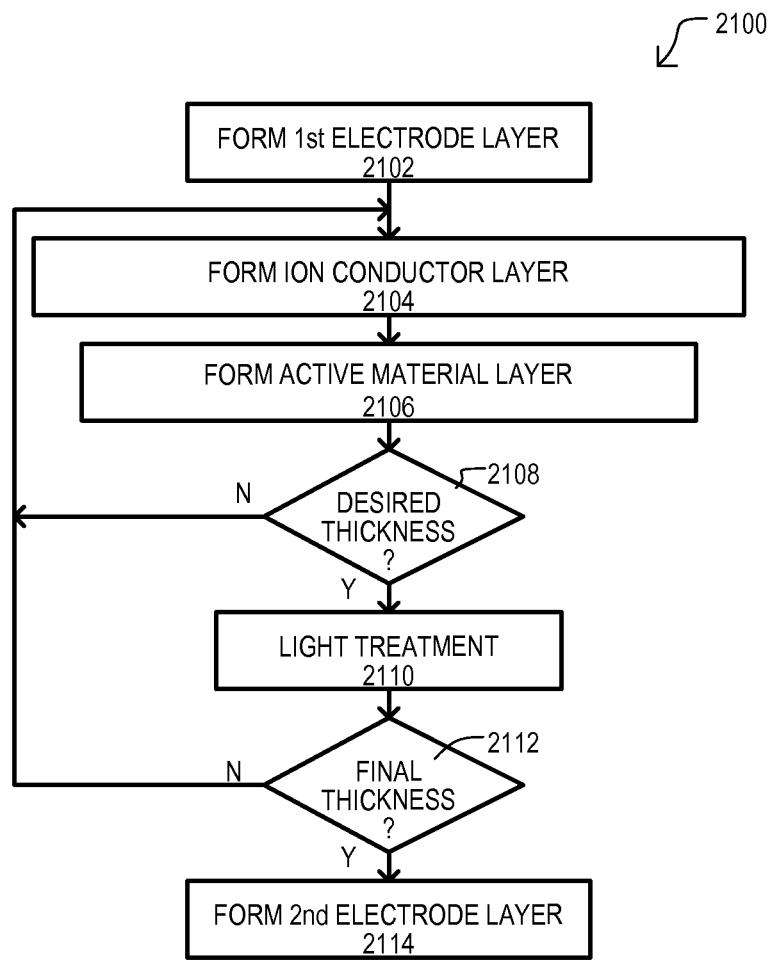
FIG. 21 is a flow diagram of a method of forming a conductive bridging memory cell according to another embodiment.

Referring now to FIGS. 21 and 22A to 22I, a method of forming a CBRAM cell according to further embodiments will now be described. FIG. 21 is a flow diagram, and FIGS. 22A to 22I are side cross sectional views corresponding to the method of FIG. 17.

Referring to FIG. 21 a method 2100 according to one embodiment may include forming a first electrode layer (step 2102), which may be an active electrode or alternatively, an indifferent electrode. An ion conductor layer may then be formed over the first electrode layer (step 2104). One example of a CBRAM stack following a step 2104 is shown in FIG. 22A.

Figure 22A:
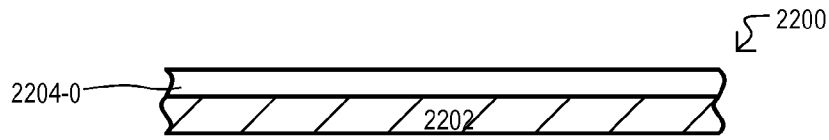
FIGS. 22A to 22I are side cross sectional views of one example of the method shown in FIG. 21.

FIG. 22A shows a first ion conductor layer 2204-0 on a first electrode layer 2202. As in the case of FIG. 18A, while FIG. 22A shows ion conductor layer 2204-0 directly on a surface of first electrode layer 2202 other embodiments may include an intervening layer.

In particular embodiments, a first ion conductor layer may be the same as, and formed in the same fashion as, those described in conjunction with FIGS. 17, 18A to 18F, and 20-A/B, above.

Method 2100 may also include forming an active material layer (step 2106). An active material layer may result in ion conductor layer forming a switching material, as described above. In one embodiment, such a step may provide conductive ions for an ion conductor layer. One example of a CBRAM stack following a step 2106 is shown in FIG. 22B.

Figure 22B:
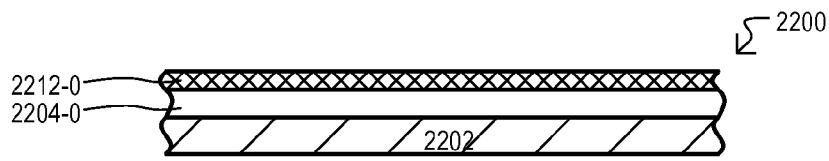

FIG. 22B shows a first active material layer 2212-0 on first ion conductor layer 2204-0. While FIG. 22B shows active material layer 2212-0 directly on a surface of first ion conductor layer 2204-0 other embodiments may include an intervening layer. In particular embodiments, a first active material layer 2212-0 material may be the same as, and formed in the same fashion as, those described in conjunction with 17, 18A to 18F, and 20-A/B, above.

Figure 22C:
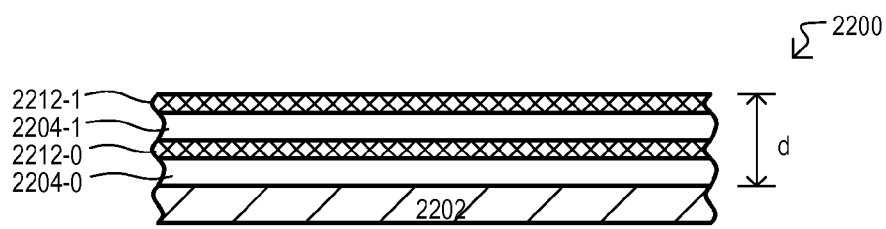

If a desired thickness for a CBRAM stack portion has not been reached, steps 2104 and 2106 may be repeated (N from step 2108). One example of CBRAM stack following a repetition of such steps to reach a desired thickness "d", is shown in FIG. 22C.

Figure 22D:
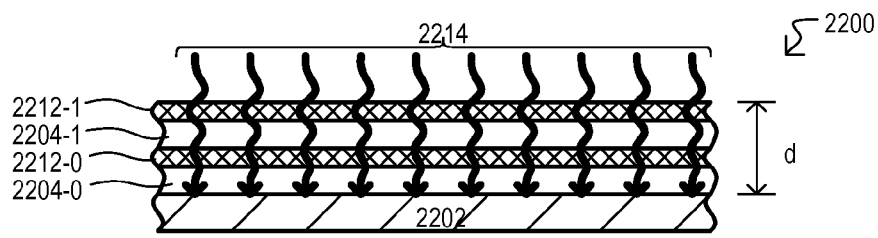

If a desired thickness for a CBRAM stack portion is reached, a CBRAM stack may be subject to a light treatment (step 2110). A desired thickness "d" may be about the same as a penetrating depth of a light source that causes conductive ions to be incorporated into ion conductor layers, to thereby form a switching material for a CBRAM cell. Such a light treatment may result in applied light penetrating through a desired thickness. One example of a CBRAM stack undergoing such a step is shown in FIG. 22D. Light 2214 may penetrate through a stack to a thickness "d". In some embodiments, such as those that include $GeS_2$ as an ion conductor layer and Ag forming all or part of the active material layer(s). In a particular embodiment, light 2214 may be ultraviolet (UV) light. One example of a CBRAM stack following a step 2110 is shown in FIG. 22E.

Figure 22E:
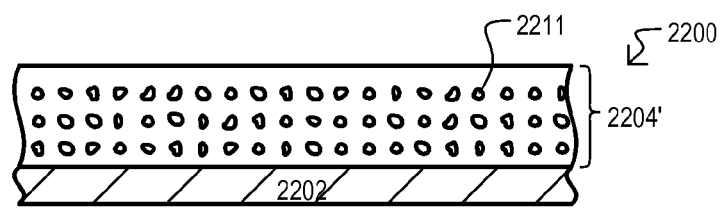

FIG. 22E shows an ion conductor layer 2204' that may now include conductive ion microstructures (one shown as 2211) incorporated throughout the layer.

Referring back to FIG. 21, a method 2100 may determine if a final thickness has been reached (step 2112). If a final thickness for a CBRAM stack has not been reached (N from 2112), steps 2104 to 2110 may be repeated, multiple times if necessary, to create a CBRAM stack ion conductor layer having switching material properties.

Figure 22F:
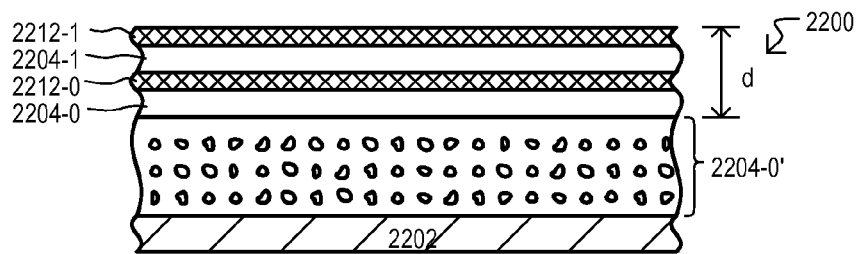

FIG. 22F shows a repeat of steps 2104 and 2106.

Figure 22G:
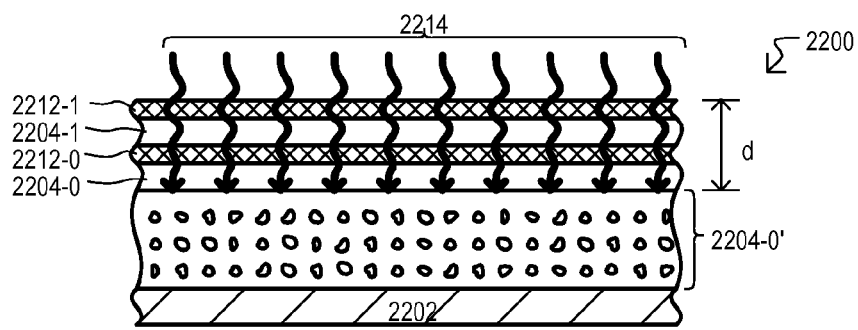

FIG. 22G shows a repeat of step 2110.

Figure 22H:
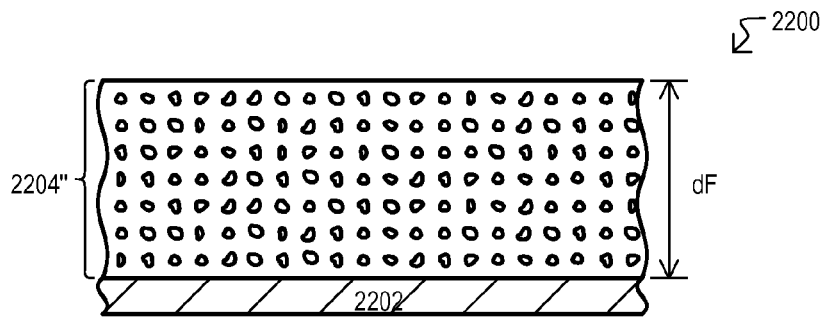

FIG. 22H shows a CBRAM stack ion conductor layer of a final thickness dF. An ion conductor layer 2204" may include conductive ion microstructures within the layer.

Figure 22I:
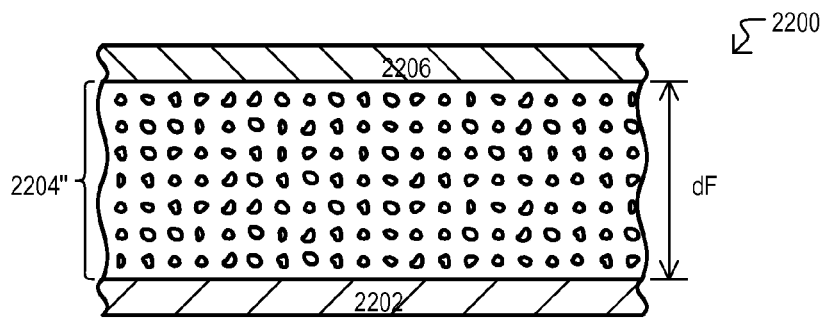

Referring again to FIG. 21, once a final thickness has been reached (Y from 2212), a second electrode layer may then be formed (step 2114). As example of a CBRAM stack following such a step is shown in FIG. 22I.

As in the case of the heat induced embodiments, while FIGS. 22B to 22G show ion conductor layers 2204-0,1,2 and ion source layers 2212-0,1,2 of uniform thickness, other embodiments can include such layers having a non-uniform thickness. A graded ion source material concentration can be designed in the ion conductor, for example, lower concentration at near bottom electrode and higher concentration at near the top electrode.

In this way, a switching memory material of a CBRAM device may be formed by alternating ion conductor layers and active material layers to a thickness, treating such layers to incorporate conductive ions into the ion conductor layers, and then repeating such steps until a desired switching material thickness has been reached.

Figure 23A:
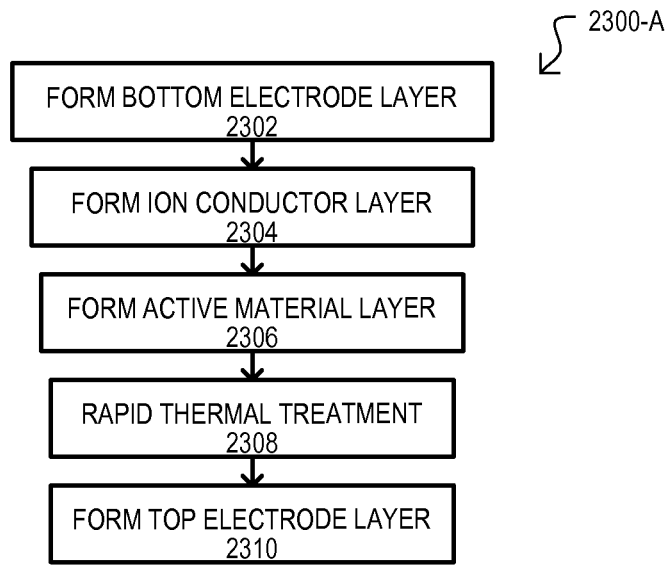
FIGS. 23A and 23B are flow diagrams of further methods of forming a conductive bridging memory cell according to other embodiments.

Referring now to FIG. 23A, a method for forming a CBRAM cell is shown in a flow diagram, and designated by the reference character 2300-A. A method may include forming a bottom electrode layer (step 2302). Such a step may include operations like those described in conjunction with item 1702 of FIG. 17. In a particular embodiment, a bottom electrode layer may form an active electrode of a resulting CBRAM cell.

An ion conductor layer may then be formed (step 2304). Such step may include operations like those described in conjunction with item 1704 of FIG. 17.

An active material layer may be formed (step 2306). Such step may include operations like those described in conjunction with item 1706 of FIG. 17.

A rapid thermal treatment may take place (step 2308) which may result in active material layer causing ion conductor layer to transform into a switching material. Such step may include operations like those described in conjunction with item 1710 of FIG. 17.

A top electrode layer may then be formed (step 2310). Such a step may include operations like those described in conjunction with item 1712 of FIG. 17.

Figure 23B:
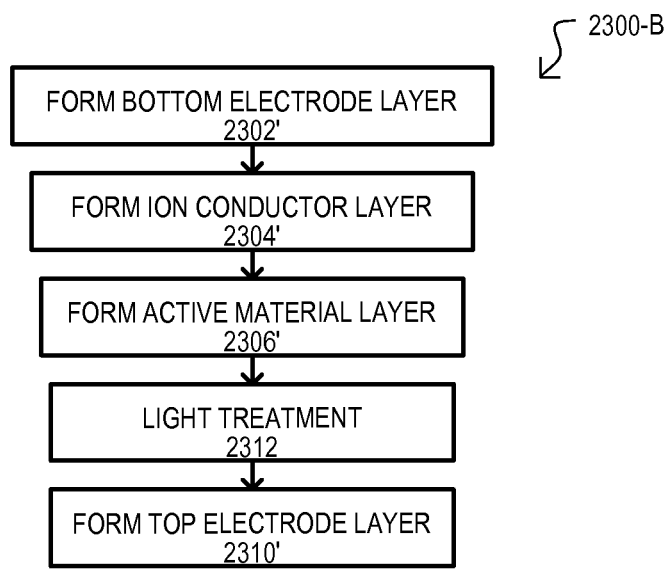

FIG. 23B shows a method according to a further embodiment is shown in a flow diagram and designated by the general reference character 2300-B. The method may include forming a bottom electrode layer (step 2302'). Such a step may include operations like those described in conjunction with item 2102 of FIG. 21. In particular embodiments, such a bottom electrode layer may form an active electrode of a resulting CBRAM cell.

An ion conductor layer may then be formed (step 2304'). Such step may include operations like those described in conjunction with item 2104 of FIG. 21.

An active material layer may be formed (step 2306'). Such step may include operations like those described in conjunction with item 2106 of FIG. 21.

A light treatment may take place (step 2312), which may result in active material layer causing ion conductor layer to transform into a switching material. Such step may include operations like those described in conjunction with item 2110 of FIG. 21.

A top electrode layer may then be formed (step 2310'). Such a step may include operations like those described in conjunction with item 2114 of FIG. 21.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A conductive bridging memory cell, comprising:
an ion conductor layer formed over an active electrode that is a source of conductive ions for the ion conductor layer;
a conductive layer formed in a vertical opening in a lower insulating layer and a barrier layer; and
the barrier layer is formed below the active electrode and in contact with the conductive layer, and formed on the top surface of the lower insulating layer, the barrier layer substantially preventing a movement of conductive ions therethrough.

2. The memory cell of claim 1, wherein:
the ion conductor layer comprises germanium sulfide ($GeS_2$); and
the active electrode comprises a metal selected from: silver and copper.

3. The memory cell of claim 1, wherein:
the barrier layer comprises a material selected from: titanium, titanium nitride, tantalum, and tungsten.

4. The memory cell of claim 1, wherein:
the active electrode is formed within an opening of an upper insulating layer; and
the ion conductor layer is formed within the opening of the upper insulating layer.

5. The memory cell of claim 4, wherein:
the active electrode is formed on at least a bottom of the opening of the upper insulating layer.

6. The memory cell of claim 5, wherein:
the active electrode is further formed on a side surface of the opening of the upper insulating layer.

7. The memory cell of claim 4, wherein:
a portion of the opening side surfaces is not covered by the active electrode.

8. The memory cell of claim 4, wherein:
the barrier layer is formed on at least a side of the opening of the upper insulating layer.

9. The memory cell of claim 1, further including:
an incorporation limiting layer formed between the active electrode and at least a portion of the ion conductor layer, the conductive ions having a more limited movement through the incorporation layer than through the ion conductor layer.

10. The memory cell of claim 1, wherein:
the ion conductor layer includes a first portion having a first conductive ion incorporation rate, and a second portion having a second conductive ion incorporation rate different than the first conductive ion incorporation rate.

11. The memory cell of claim 10, wherein:
the first portion has a different material density than the second portion.

* * * * *